(12) United States Patent
Kazahaya et al.

(10) Patent No.: US 7,883,775 B2
(45) Date of Patent: Feb. 8, 2011

(54) DIAMOND FILM COATED TOOL AND PROCESS FOR PRODUCING THE SAME

(75) Inventors: Katsuo Kazahaya, Hyogo (JP); Shigetaka Kawai, Hyogo (JP); Yasushi Matsumoto, Hyogo (JP); Keiji Ishibashi, Hyogo (JP); Takahiro Imai, Hyogo (JP)

(73) Assignees: A.L.M.T. Corp., Tokyo (JP); Sumitomo Electric Industries, Ltd., Osaka (JP)

( * ) Notice: Subject to any disclaimer, the term of this patent is extended or adjusted under 35 U.S.C. 154(b) by 279 days.

(21) Appl. No.: 10/566,633

(22) PCT Filed: Nov. 12, 2003

(86) PCT No.: PCT/JP03/14401
§ 371 (c)(1),
(2), (4) Date: Jan. 31, 2006

(87) PCT Pub. No.: WO2005/011902
PCT Pub. Date: Feb. 10, 2005

(65) Prior Publication Data
US 2006/0216515 A1    Sep. 28, 2006

(30) Foreign Application Priority Data
Jul. 31, 2003   (JP) .............................. 2003-283835

(51) Int. Cl.
*B32B 9/00* (2006.01)
(52) U.S. Cl. ..................................... 428/408
(58) Field of Classification Search ................. 428/408
See application file for complete search history.

(56) References Cited
U.S. PATENT DOCUMENTS
4,769,070 A    9/1988   Tobioka et al.
(Continued)

FOREIGN PATENT DOCUMENTS
DE    101 30 590 A1    11/2002
(Continued)

OTHER PUBLICATIONS

Tribochemistry Between Hydrogen and Diamond Like Carbon Films, Fontaine; Surface and Coating Technology 146-147 (2001) 286-291.*
(Continued)

*Primary Examiner*—Angela Ortiz
*Assistant Examiner*—Daniel Miller
(74) *Attorney, Agent, or Firm*—McDermott Will & Emery LLP

(57) ABSTRACT

The invention provides a diamond coated tool having an excellent cutting performance, wear resistance, adhesion resistance and work surface roughness in combination and a method of producing such a tool.

A diamond coated tool comprising a substrate and a diamond coating formed on the surface of the substrate, wherein said substrate is made of a cemented carbide or a cermet, diamond grains constituting a growth surface of said diamond coating has an average grain size of about 1.5 micrometers or below, said diamond coating has a thickness ranging from about 0.1 micrometer to 20 micrometers, and said diamond coating has an average surface roughness Ra ranging from about 0.01 micrometer to 0.2 micrometer. Such a diamond coated tool can be obtained by carburizing the substrate consisting of a cemented carbide or a cermet, and growing up a diamond coating thereon.

15 Claims, 12 Drawing Sheets

U.S. PATENT DOCUMENTS

| | | | |
|---|---|---|---|
| 5,571,615 A * | 11/1996 | Phillips et al. | 428/336 |
| 5,803,967 A * | 9/1998 | Plano et al. | 117/102 |
| 5,955,212 A | 9/1999 | Matsumoto et al. | |
| 6,547,494 B2 | 4/2003 | Hanyu | |
| 2002/0001717 A1 | 1/2002 | Hanyu | |
| 2004/0060742 A1 * | 4/2004 | Kembaiyan et al. | 175/434 |
| 2004/0141867 A1 | 7/2004 | Dreyer et al. | |

FOREIGN PATENT DOCUMENTS

| | | |
|---|---|---|
| JP | 63-227739 | 9/1988 |
| JP | 3-115571 A | 5/1991 |
| JP | 04-354873 | 12/1992 |
| JP | 05-146820 | 6/1993 |
| JP | 06-065758 | 3/1994 |
| JP | 08-239297 | 9/1996 |
| JP | 8-259391 A | 10/1996 |
| JP | 09-104943 | 4/1997 |
| JP | 10-087396 | 4/1998 |
| JP | 2772494 | 4/1998 |
| JP | 11-58106 A | 3/1999 |
| JP | 2001-179504 A | 7/2001 |
| JP | 2002-79406 A | 3/2002 |
| JP | 2003-160866 | 6/2003 |
| JP | 2003-247006 A | 9/2003 |
| WO | WO 02/092866 A | 11/2002 |

OTHER PUBLICATIONS

Kensuke Inoue, "Evaluation of Thin Film According to RBS/HFS Method, RBS Channeling Method and HR-RBS Method", The TRC News, Oct. 2002, pp. 31-34, No. 81, Toray Research Center. (English translation).

"The TRC News", No. 81, Oct. 2002, pp. 31-34, Toray Research Center.

Chinese Office Action, with English Translation, issued in corresponding Chinese Patent Application No. 20380110412.0, dated on Jun. 29, 2007.

Chinese Office Action, with English Translation, issued in corresponding Chinese Patent Application No. 200380110412.0, dated on Jun. 29, 2007.

Japanese Office Action, w/ English translation thereof, issued in Japanese Patent Application No. JP 2005-507414 dated Apr. 22, 2009.

Japanese Final Office Action, w/ English translation thereof, issued in Japanese Patent Application No. JP 2005-507414 dated Aug. 17, 2009.

Supplementary European Search Report issued in European Patent Application No. EP 03 77 2725.2 dated Sep. 18, 2009.

* cited by examiner

1 μm

US 7,883,775 B2

DIAMOND FILM COATED TOOL AND PROCESS FOR PRODUCING THE SAME

RELATED APPLICATIONS

This application is the U.S. National Phase under 35 U.S.C. §371 of International Application No. PCT/JP2003/014401, filed on Nov. 12, 2003, which in turn claims the benefit of Japanese Application No. 2003-283835, filed on Jul. 31, 2003, the disclosures of which Applications are incorporated by reference herein.

TECHNICAL FIELD

The present invention relates to diamond coated tools used as cutting tools, wear-resistant tools, adhesion-resistant tools, etc. and a method of manufacturing such tools. More specifically, the tool of the present invention is used in such fields of application as working of aluminum alloys or magnesium alloys involving difficult machinability and requiring lower roughness of work surfaces, drilling of glass-reinforced epoxy resins or like materials requiring sharpness and adhesion resistance of major cutting edges, semi-dry cutting, or tools for IC or LSI packages fabrication including bending or cutting of outer leads in semiconductor equipment.

BACKGROUND ART

Heretofore, are known cutting tools, wear-resistant tools and the like employing as their substrate a cemented carbide or ceramics such as silicon nitride or silicon carbide and having their substrates coated with a diamond film in order to improve the wear resistance and adhesion resistance. Generally, such a diamond coating is formed by a chemical vapor deposition or a like process, and grains constituting the diamond film have a size larger than about 4 micrometers (μ). How the crystal grows in a coating process of such a diamond film of the prior art is shown in FIG. 3. According to the prior art method, when a substrate 5 is set in a CVD equipment, for example, and placed under predetermined conditions, diamond nuclei 1 will be produced on the surface of a substrate 5, as shown in FIG. 3(*a*). Then if the conditions setting is changed to grow the nuclei 1, they will develop principally in a direction perpendicular to the surface of the substrate 5 to grow into grains 2, as shown gn FIG. 3(*b*), and these grown grains 2 will join together so as to form a diamond film 6.

If the diamond has a larger grain size W as illustrated above, adjacent grains of the diamond film 6 will form generally sharp V-shaped recesses on the order of micron in the surface so that the film 6 will have unevenness in its surface to make the surface lusterless. Further, when using the diamond coating for cutting tools and the like, the above-mentioned unevenness just represent the surface roughness of such tools, and the unevenness will partially be transferred to a work to further the roughness of the work surface. Besides, since the unevenness capture and hold chips firmly, such a tool has problematically tended to cause adhesion during working with a resultant loss in performance.

To solve such problems as described above, diamond coated tools having a diamond coating or film comprising fine grains of about 1 micrometer or below in grain size are proposed recently. As a typical example, a patent document 1 (Japanese Provisional Patent Publication JP A H11-58106, pp. 3-5, and FIGS. 5, 6 and 7) discloses a diamond coated tool in which the diamond coating has a 3 micrometers or smaller grain size and a surface roughness of 3 micrometers or less in Rmax subject to JIS B 0601.

Another patent document 2 (Japanese Provisional Patent Publication JP A 2002-79406, pp. 2, 4-7) discloses a diamond coated tool in which the diamond coating has a 2 micrometers or smaller grain size. The invention disclosed in this patent document 2 provides also a method of manufacturing such a diamond coated tool permitting its diamond coating to have a grain size of 2 micrometers or below. How the diamond grows in this method of the prior art is shown in FIG. 4. According to this method of manufacturing a diamond coated tool of the prior art, diamond nuclei 1 is first produced on the surface of a substrate 5 as shown in FIG. 4(*a*), and the nuclei 1 are grown until the grain size W in the growth directions reaches approximately 1 micrometer as shown in FIG. 4(*b*), whereupon the growth is stopped. Then, as shown in FIG. 4(*c*), conditions are set again to produce nuclei 1 so that they emerge on the thus grown diamond grains 2. And these new nuclei 1 are grown to diamond grains 2 on the former diamond grains 2, as shown in FIG. 4(*d*). In this case also, the growth is stopped when the grain size W reaches 1 micrometer. Furthermore, this method of the prior art also proposes to form a diamond film 6 by repeating the process steps shown in FIGS. 4(*c*) and 4(*d*). According to the prior art inventions, it is said that the smaller diamond grain size is effective for reducing the unevenness in the surface of the diamond coating 6 to improve work surfaces in roughness.

DISCLOSURE OF THE INVENTION

However, in spite of such reduction in grain size, a problem may arise in that neither a work surface roughness nor a working precision is improved significantly. In this regard, it is assumed that since the diamond coating gives a roundness to the cutting edge of a tool like the case of coarse grains and makes the edge surface itself too smooth, the tool may have an inadequate engagement to the work to cause its chatter or its unexpected disengagement or relief. Besides, for semi-dry cutting using only a very little quantity of coolant during working, although it is necessary to efficiently supply a coolant to a spot of the tool (acting or working spot) where it exerts its cutting action to the work, the coolant will not be retained adequately due to a too smooth tool or edge surface and thus will not be supplied to the working spot, causing a problem in that the working precision is lowered and the tool life is shorted significantly. Moreover, for bending or cutting outer leads of semiconductor packages, for example, any sharp V-shaped recesses in the tool surface will deteriorate the adhesion resistance of the tool to solder covering the surface of the outer leads even if the grain size of diamond is reduced to some extent.

In view of the above-described problems, the present invention has for its object to provide a diamond coated tool significantly improved in working precision and tool life that can exert a good engagement to works and secure an efficient supply of coolant to a working site even in semi-dry cutting and a method of manufacturing such a diamond coated tool.

In an effort to cover a substrate with a diamond film in an improved manner, the inventors found out that a diamond coating having superior properties can be produced by first forming diamond aggregates under predetermined conditions and then developing such aggregates. That is to say, the inventors could successfully fabricate a diamond coated tool which has a thin diamond film of fine grain size presenting a smooth coating surface and which can still have a major cutting edge exerting a good engagement during working and effectively retain a coolant in semi-dry cutting.

In its one aspect, the present invention provides a diamond coated tool comprising a substrate and a diamond coating formed on the surface of the substrate, wherein the substrate is made of a cemented carbide or a cermet, grains constituting a growth surface of the diamond coating has an average grain size of about 1.5 micrometers or below, and the diamond coating has a thickness ranging from about 0.1 micrometer to 20 micrometers and an average surface roughness Ra ranging from about 0.01 micrometer to 0.2 micrometer. The "growth surface" herein referred to means typically a surface of coating as it is formed in producing the diamond coating by vapor-phase synthesis. Also, it includes a polished surface of the coating after it is produced by vapor-phase synthesis. The polished surface denotes typically a surface polished to such a extent that unevenness created by diamond grains remain without being removed by polishing. The average grain size is given based an observation of coating surfaces by scanning electron microscope (SEM).

The cemented carbide or cermet forming the substrate has a high hardness and a high strength to provide a very excellent cutting tool if coated with diamond under proper conditions. The "cemented carbide" herein referred to represents a sintered compact comprising a hard phase mainly composed of a tungsten carbide and a binding phase consisting of an iron group metal such as cobalt, and the "cermet" herein represents a sintered compact comprising a hard phase consisting of at least one of titanium nitride and tungsten carbide in addition to titanium carbide and a binding phase consisting of an iron group metals such as cobalt, nickel, etc. It is preferred that the substrate surface for diamond coating have an adequate roughness. This is because the surface condition of the substrate is reflected on the surface of the diamond coating to improve the engagement to a work material. Such an adequate surface roughness is not achieved by polishing, but achieved by grinding the substrate.

According to the present invention, the diamond grains have a grain size of about 1.5 micrometers or less. By forming the diamond coating from such fine grains, the coating can have a smooth surface.

According to the present invention, the diamond coating has a thickness in the range of about 0.1 micrometer to 20 micrometers. This thickness of 0.1 micrometers or above is required for the diamond coating to maintain a sufficient strength as a cutting tool or a wear-resistant tool. Meanwhile, the coating thickness has the above-mentioned upper limit of 20 micrometers because if the thickness exceeds this upper limit the residual stress in the diamond coating will increase so that the coating tends to peel from the substrate of cemented carbide or cermet. It is more preferred that the coating thickness range from about 3 micrometers to 12 micrometers.

Further, according to the present invention, the diamond coating has an average surface roughness Ra in the range of about 0.01 micrometers to 0.2 micrometers. If the average surface roughness is lower than this lower limit, it becomes impossible to fully expect the coating to retain a coolant at a working spot of the tool due to an excessive surface smoothness of the coating. An average surface roughness exceeding the upper limit will result in an increase in cutting force or resistance and a reduction in adhesion resistance. More preferably, the average surface roughness Ra ranges from about 0.05 micrometers to 0.15 micrometers.

In its second aspect, the present invention provides a diamond coated tool, wherein the diamond coating consist of fine grains which are disposed as elongated fine grains extending longitudinally in a growth direction of the diamond coating in cross-section thereof and have a minor axis diameter in the rage of about 0.001 micrometer to 0.1 micrometer. Here, the diamond grains are aggregates of the fine diamond grains. If a diamond coating of coarse grains formed by ordinary vapor-phase synthesis has the same thickness as that of the diamond coating according to the present invention, its grains have almost the same length and width in cross-section. Meanwhile, it is assumed that according to the present invention the elongated fine grains are produced by repeating a process of first growing the fine diamond grains to stop the growth before the fine grains reach 1 micrometer in length and then likewise growing the fine diamond grains on the thus grown fine grains. Consequently, the minor axis diameter is also limited as described above. Such an internal state of the diamond coating may be observed by polishing and etching its cross-sectional surface, as will be described herein later. In this connection, the fine diamond grains may be regarded as primary grains, while aggregates of the primary grains constitute the diamond grains, which may be regarded as secondary grains, as will be also described herein later. Further, these diamond grains aggregate to form tertiary grains.

In its third aspect, the present invention provides a diamond coated tool, wherein the aforesaid elongated fine diamond grains have an aspect ratio ranging from about 2 to 20. For the aspect ratio, namely a ratio of major axis diameter vs. minor axis diameter of a fine diamond grain, it is more preferable to limit the same to the range of about 2 to 10. If the aspect ratio is too large, the fine grains will exhibit a lower hardness with resultant susceptibility to wear.

In its fourth aspect, the present invention provides a diamond coated tool, wherein at least a part of the elongated fine diamond grains are formed like leaves of Japanese cedar in shape. What causes such an observed result is not figured out yet, but it is assumed to be attributable to twins of such fine diamond grains.

In its fifth aspect, the present invention provides a diamond coated tool, wherein the diamond coating has a specific relationship between the peak height D for diamond and the peak height G for graphite or an amorphous carbon in a Raman spectroscopic analysis. Specifically, the ratio of D/G falls within the range of about 0.5 to 5, according to the present invention. With the ratio within this range, the diamond crystals will not grow to a large grain size and can form a coating film of fine grains. In this regard, a peak D appearing in the vicinity of 1333 $cm^{-1}$ in a Raman spectroscopic analysis is a peak resulting from an sp3 hybridized orbital of diamond, and a peak G appearing in the range of 1,550±150 $cm^{-1}$ is a peak resulting from an sp2 hybridized orbital that exists in graphite, amorphous carbon, etc. Therefore, it can be said that the higher the D/G is, the more perfect diamond will be coated.

In its sixth aspect, the present invention provides a diamond coated tool, wherein the diamond coating has a ratio $I_{220}/I_t$ not smaller than about 0.6, where $I_{220}$ is a peak intensity of the diamond crystal face (220) and $I_t$ is a total of peak intensities of diamond crystal faces (111), (220), (311), (400) and (331) as observed in X-ray diffractometry of the diamond coating. In respect of crystal orientation, it is a preferable feature of the diamond coating produced according to the present invention that the growth plane of the diamond coating involves the above-describe orientation.

In its seventh aspect, the present invention provides a diamond coated tool, wherein the diamond coating has a hydrogen content in the range of about 1% to 5% by atomic ratio (at %). With 1 at % or higher hydrogen content, since the diamond coating will have a lowered elastic modulus to become resistant to cracking and thus its peeling can be prevented. Meanwhile, if the hydrogen content exceeds its 5 at % upper limit, the diamond coating will have a decreased hardness cannot exhibit an adequate performance as a diamond coated tool. Usually, it is difficult to make a diamond, such a highly crystalline substance, contain such a large quantity of hydrogen. According to the present invention, the diamond coating has a diamond crystal structure in spite of a high hydrogen content as above, the diamond coating has a peak of diamond in XRD (X-ray diffraction) analysis.

Here, a measurement method of hydrogen content of the diamond coating will be described in greater detail. For a diamond coating on a substrate of simple substance such as an Si substrate, the hydrogen content can be measured by an infrared absorption spectrophotometer (IR), but it is difficult to measure the hydrogen content with a high degree of accuracy in the case of a diamond coating on a multi-element substrate such as a cemented carbide. Thus, for the present invention, the hydrogen content of the diamond coating on a cemented carbide substrate is measured with sufficient accuracy by combining a hydrogen forward scattering analysis (HFS) method and a Rutherford back scattering analysis (RBS) method. This measurement method is described, for example, in THE TRC NEWS, No.81, October 2002, pp. 31-34, Toray Research Center.

In its eighth aspect, the present invention provides a diamond coated tool, wherein the diamond coating is formed as a single layer in a cross-sectional zone of about 70% of its thickness above the substrate surface. Since the growth rate of diamond coating usually varies with a slight difference in conditions, growth of the diamond coating is suspended to measure its thickness when it has grown to a thickness almost exceeding 70% of its scheduled thickness in the process according to the present invention. Then, the thickness of the coating to be additionally formed is determined, and typically such an additional coating is grown under the same conditions as in the preceding coating step. In this course, since the boundary layer is formed in the coating at a position where the coating process was suspended, and such boundary layers are formed at the same number of positions as the number of times the coating was suspended. Thus, the diamond coating is formed as a single layer in a cross-sectional zone of at least about 70% of its thickness above the substrate surface. The diamond coating may be formed in single or multiple layers for a remaining zone of the diamond coating.

In its ninth aspect, the present invention provides a diamond coated tool, wherein the substrate comprises a cemented carbide containing about 0.1 mass % to 6 mass % of Co. The cobalt content is limited to 6 mass % as its upper limit because it adversely affects the formation of diamond coating, while it is limited to 0.1 mass % as its lower limit in consideration of a minimum level permitting an industrial production of the cemented carbide. If a cemented carbide composition having its Co content partially substituted with Cr or V is sintered, the crystal growth of the tungsten carbide constituting a hard phase is inhibited and a high-strength cemented carbide having a fine hard phase can be produced.

In its tenth aspect, the present invention provides a diamond coated tool, wherein the substrate has a magnitude of saturation magnetization not smaller than 1,900×(binding phase content of alloy (by mass %))/100 (G-cm$^3$/g) but not greater than 2,023×(binding phase content of alloy (by mass %))/100 (G-cm$^3$/g). Usually, cobalt contained in a cemented carbide has a magnitude of saturation magnetization in the range of 1,600-2,023 (G-cm$^3$/g). However, for the present invention, it is preferred that the saturation magnetization be in the range of about 1,900-2,023 (G-cm$^3$/g). Saturation magnetization denotes the magnitude of magnetization in the state of magnetic saturation and is equal to the strength of spontaneous magnetization in ferromagnetic substances such as cobalt.

The magnitude of saturation magnetization is dependent on the Co content of the cemented carbide, the content of substances dissolved as solid solution in cobalt and the carbon content of the alloy. If the carbon content of an alloy increases, the magnitude of saturation magnetization of Co will increase because the content of tungsten (W) dissolved as solid solution in Co decreases as it separates out as WC. Therefore, if the magnitude of saturation magnetization of the cemented carbide is smaller than the lower limit described above, the carbon content will run short in the cemented carbide, and the density of diamond nuclei produced on the substrate will be reduced when forming the coating film. If the upper limit saturation magnetization is exceeded, free carbon will be separated out into the cemented carbide to decrease its strength. According to the present invention, a diamond is applied to the substrate and is supposed to yield seeds on which nuclei are generated. Since a fine diamond is applied, it is preferred that a proper extent of carburization of the substrate be secured so as to prevent the diamond turned into free carbon to diffuse into the cemented carbide.

According to eleventh aspect, the present invention provides a diamond coated tool, wherein the substrate having its Co content partially substituted with Cr has a magnitude of saturation magnetization not smaller than 1,900×(binding phase content of alloy (by mass %))/100×0.93 (G-cm$^3$/g) but not greater than 2,023×(binding phase content of alloy (by mass %))/100 (G-cm$^3$/g). If the binding phase of the cemented carbide contains Cr, its magnitude of saturation magnetization decreases about 7%.

In its twelfth aspect, the present invention provides a diamond coated tool, wherein the diamond coating is formed partially on the substrate surface, and the substrate has a magnitude of saturation magnetization Ms satisfying the following condition A in its area that is at least about 5 mm apart outside from the outer border of the diamond coating along the substrate surface:

A: 1,900×(binding content of alloy (mass %))/100 (G-cm$^3$/g)≦Ms≦2,023×(binding content of alloy (mass %))/100 (G-cm$^3$/g).

If the substrate surface is subjected to carburization only in its area to be diamond coated, the carburization will not be sufficient at its area near the non-carburized area even if the former is in its carburized area, thus possibly causing peeling of the diamond coating therefrom. Thus, according to the present invention, it is preferred that when the coating is to be partially provided the carburization be extended to such an area of the substrate surface that is at least 5 mm apart outside from the outer border of the area for diamond coating. By way of example, the carburization may be accomplished by heating a filament of a deposition system when a filament process is employed for growing the coating film, or alternatively any heating devices other than filament may be used to provide the carburization to such an extended area at least 5 mm apart outside from the outer border of the area to be diamond coated as above.

In its thirteenth aspect, the present invention provide a diamond coated tool, wherein the substrate has its Co content partially substituted with Cr, the diamond coating is formed partially on the substrate surface, and the substrate has a magnitude of saturation magnetization Ms satisfying the following condition B in its area that is at least about 5 mm apart outside from the outer border of the diamond coating along the substrate surface:

B: 1,900×(binding content of alloy (mass %))/100×0.93 (G-cm$^3$/g)≦Ms≦2,023×(binding content of alloy (mass %))/100 (G-cm$^3$/g).

This aspect specifies the magnitude of saturation magnetization of a substrate when it has its Co content substituted with Cr. Also in this case, by extending the carburization to an area at least 5 mm apart outside from the outer border of the area for diamond coating and limiting the magnitude of saturation magnetization as above, the peeling of the diamond coating can be effectively inhibited.

In its fourteenth aspect, the present invention provides a diamond coated tool, wherein the diamond coating has surface unevenness in the range of about 15 nm to 200 nm in RMS (root mean square) value as measured by an atomic force microscope (AFM). The RMS (or root mean square average) value is a typical form of expression of average values and often used for various parameters of oscillatory phenomena such as amplitude, for example. As used herein, however, the RMS refers simply to of the reading on an RMS scale of an atomic force microscope representing surface unevenness. This value parametrically gives an indication of the brightness and the dispersion of reflected light. With the RMS not smaller than 15 nm but not greater than 200 nm, the resultant diamond coated tool will have not only an improved cutting performance and coolant retention but also an excellent appearance. More preferably, the RMS ranges from about 15 nm to 100 nm.

In its fifteenth aspect, the present invention provides a diamond coated tool, wherein the substrate has in its outer zone closer to its surface a composition having a binding phase content lower than that in its inner area inside the outer zone, and the outer zone ranges from about 1 micrometer to 20 micrometers in depth. The binding phase herein referred comprises iron group metals such as Co and nickel. By providing the above-described outer zone having a composition containing a lower quantity of binding phase to a depth of at least about 1 micrometer from the substrate surface, the binding phases of the substrate can be prevented from generating soot during coating and consequently the diamond coating can be improved in adhesion. Meanwhile, the substrate can maintain an adequate strength in the outer zone closer to its surface by limiting such an outer zone having a lower binding phase content up to 20 micrometers in depth. According to the present invention, since the diamond coating comprises fine grains as mentioned above and proper retention of coolant is ensured even in semi-dry cutting, the cutting force is rendered very small. Thus, by forming such an outer zone having a composition containing a lower quantity of binding phase, the substrate surface can have a significantly reduced content of the binding phase metal that lowers the coating adhesion and thus the diamond coating will have much improved adhesion, but tool breakage or a like failure will not occur so long the outer zone is limited in depth up to 20 micrometers from the substrate surface.

Further, according to the present invention, it is preferred that the substrate surface contains not more the about 6 mass % of the binding phase metal. The binding phase content may be zero in the substrate surface. Although it was not preferable in the past to reduce the content of the binding phase metal in the substrate surface to 0 mass % considering the strength of substrate in the vicinity of its surface, such zero content of the binding phase metal in the surface does not matter in the present invention, since the diamond coating comprises smaller grains so that only a smaller cutting force is encountered and thus since tool breakage due to breakage of the substrate itself will not occur. Particularly, if the outer zone having a lower content of binding phase metal is limited in depth up to 20 micrometers from the substrate surface as described above, tool breakage will not occur, as well. For the above-described outer zone of having a lower content of binding phase metal, a cross-section of the coated substrate may be observed by polishing and subjecting it to a line analysis of the binding phase metal using an EDX-SEM (energy dispersive X-ray spectroscopy-scanning electron microscope) method.

In its sixteenth aspect, the present invention provides a diamond coated tool, wherein the diamond coating is provided as it is produced through a vapor-phase synthesis process. The diamond coating of the present invention may be used as it is formed through a vapor-phase synthesis without any further processing. Cutting tools coated with the prior art diamond films comprising coarse grains provide an inferior cutting face involving considerable unevenness and cannot be used for works such as semi-dry cutting that may encounter severe adhesion. Meanwhile, since the diamond coating of the tool according to the present invention has a smooth growth plane, it may be used as a cutting tool with a growth plane as produced. Since the tool will exhibit an inadequate engagement to the work material if its surface is too smooth, the substrate is ground instead of being polished, and then coated with diamond on its surface having grinding traces so that the surface roughness of the substrate will positively affect the surface configuration of the coating to yield a good engagement.

In one aspect of the method, the present invention provides a method of manufacturing a diamond coated tool, the method comprising preparing a substrate of a cemented carbide or a cermet tool having substantially a shape of the intended tool, carburizing the substrate, and coating the substrate with diamond in an atmosphere of a hydrogen-hydrocarbon mixed gas under pressure of about 0.13-6.5 kPa.

Here, the substrate comprises a cemented carbide or a cermet. Cobalt, nickel, or a like is used as a binding phase metal of the substrate, as described previously. A polycrystalline diamond aggregate can be formed with a high density by carburizing such a substrate by heat treatment and then growing diamond crystals thereon under specific conditions so as to coat the substrate with diamond.

Preferably, the carburization is accomplished for 3-9 hours in an atmosphere of a 1-99 vol. % methane-hydrogen mixed gas at 800-1,100 ° C. under pressure of 0.65-13.3 kPa. For coating the substrate with diamond, it is preferred to process the substrate in an atmosphere of a 1-5 vol. % methane-hydrogen mixed gas of under pressure of 0.13-6.5 kPa and at a filament temperature of 1,800-2,200° C., while maintaining the substrate at 720-900 ° C. Most preferably, this diamond coating process is accomplished by a hot-filament CVD method or microwave plasma CVD method from a viewpoint of productivity. However, a plasma jet method, arc discharge plasma CVD method or high frequency plasma CVD method may be employed likewise without causing any technical problems.

According to the present invention, the polycrystalline diamond aggregate formed on the carburized substrate features that each diamond aggregate contains a significantly larger number of fine grains as compared with a coating formed on a non-carburized substrate. Consequently, a diamond coating with an average grain size of about 1.5 micrometers or below can be produced easily. These two process steps or components, namely carburization and coating processes, are both essential for the method of the present invention, and no satisfiable result will be achieved if one or the other process is omitted. Moreover, the above-mentioned two processes can also grow hard phase grains or particles of the substrate. The hard phase grains herein referred to denote hard carbide grains including those of WC, TaC, NbC, VC, $Cr_3C_2$, TiC, and $Mo_2C$. The growth of hard phase grains greatly strengthens the adhesion of the diamond coating. For carburization, a method disclosed in the Japanese Patent No. 2772494 or another method proposed in the Japanese Patent Provisional Publication JP A No. 2003-160866 may be employed effectively.

In a second aspect of the method, the present invention provides a method of manufacturing a diamond coated tool, further comprising a diamond application step for applying a diamond not larger than about 500 Å (50 nm) in average grain size to the surface of the carburized substrate. This is effective for increasing the density of generated nuclei, so that it becomes easy to obtain a small diamond coating of a smaller grain size. Although it is preferred that the diamond thus applied have a smaller gain size as possible, a currently available minimum grain size is approximately 20 Å (2 nm). The applied diamond has an average grain size of not greater than 500 Å (50 nm) as its upper limit, because the resultant diamond aggregate will become too large as the grains grow if the average grain size exceed this upper limit.

In a third aspect of the method, the present invention provides a method of manufacturing a diamond coated tool, wherein the applied diamond comprises a polycrystalline diamond. Although the diamond applied to the carburized substrate yields nuclei for diamond growth, polycrystalline nuclei tend to produce also a polycrystalline diamond, and thus it is preferred to apply a polycrystalline diamond rather than a single crystal diamond with a view to obtaining fine diamond crystal. In other words, by providing a polycrystalline diamond as the nuclei before undergoing growth, the nuclei tend to grow into a polycrystalline diamond aggregate.

Preferably, the diamond is applied to the carburized substrate by means of an ultrasonic wave. This allows the diamond to be applied on the substrate firmly with high density.

In its fourth aspect of the method, the present invention provides a method of manufacturing a diamond coated tool, further comprising an acid treatment step for treating the substrate surface with an acid to partially remove the binding phase metal, the acid treatment step being interposed between the carburization step and the diamond application step. This acid treatment decreases the binding phase metal in the substrate surface to improve adhesion of the diamond coating to the substrate.

Particularly preferably, the method of manufacturing the diamond coated tool according to the present invention comprises a combination of the partial removal of the binding phase metal and the diamond application as described above. That is, this preferred method of the present invention comprises subjecting the carburized substrate surface to the acid treatment to partially remove the binding phase metal, applying a diamond powder on the substrate surface, placing the substrate in hot-filament CVD equipment, and producing globular diamond aggregates which in turn forms a diamond coating that is used as it is formed without subjecting to polishing. By partially removing the binding phase metal of the substrate surface, the adhesion of the diamond coating to the substrate can be strengthened. Also, by applying a diamond powder to the substrate surface as a pretreatment of the coating process, the density of generated diamond nuclei can be increased during coating.

As will be understood from the foregoing description, the diamond coated tool of the present invention is hard to undergo adhesion to its diamond coating surface and allows working to achieve an improved work surface roughness. Besides, a longer tool life can be achieved because the diamond coating is hard to peel from the substrate. Further, the method of manufacturing the diamond coated tool of the present invention can form a diamond coating with a smaller grain size can produce, and can readily manufacture a diamond coated tool capable of highly precise working. Even a tool such as a tap can be made less liable to adhesion by providing it with the diamond coating of the present invention.

BEST MODE FOR CARRYING OUT THE INVENTION

Hereafter, the present invention will be described in greater detail based on the preferred embodiments thereof.

Figure 1:
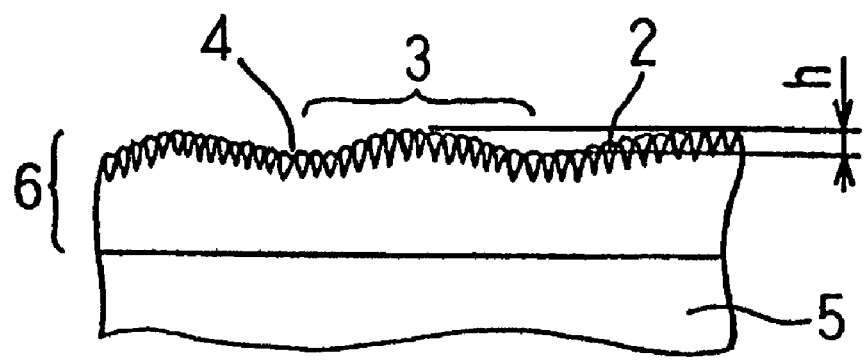
FIG. 1 is a cross-sectional conceptual diagramkey map showing a diamond coated tool of the present invention in a zone near its surface.
Figure 2:
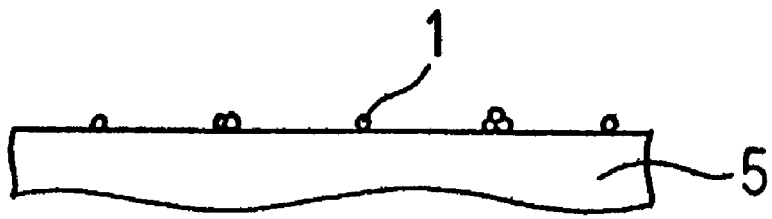
FIG. 2 is a schematic illustrative view showing how a diamond grows in the method of the present invention, with (a) through (d) showing steps of growth, respectively.
Figure 2:
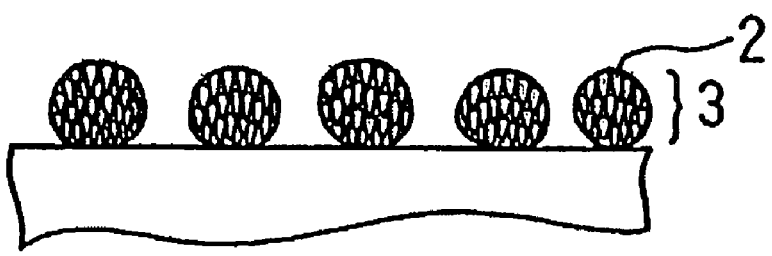
Figure 2:
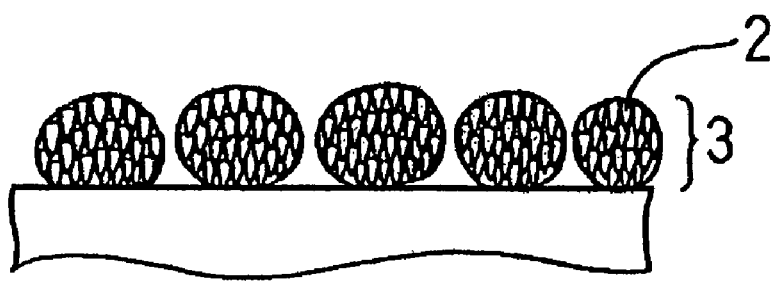
Figure 2:
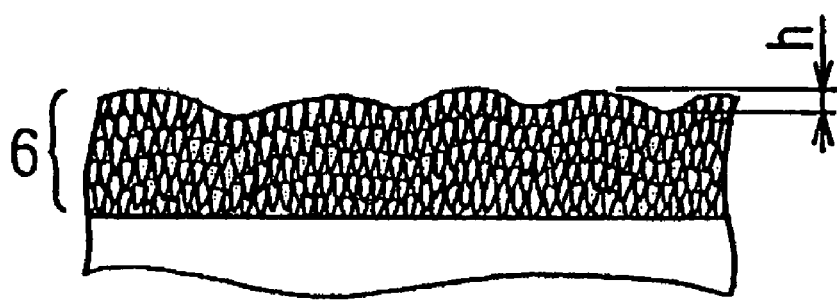
Figure 3:
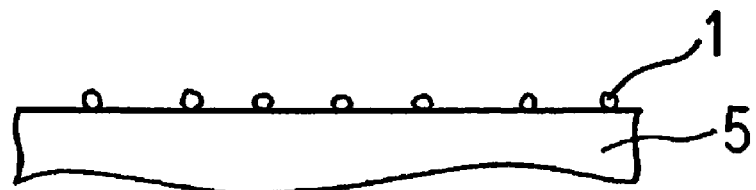
FIG. 3 is a schematic illustrative view showing how a diamond grows in the method of the prior art, with (a) through (b) showing steps of growth, respectively.
Figure 3:
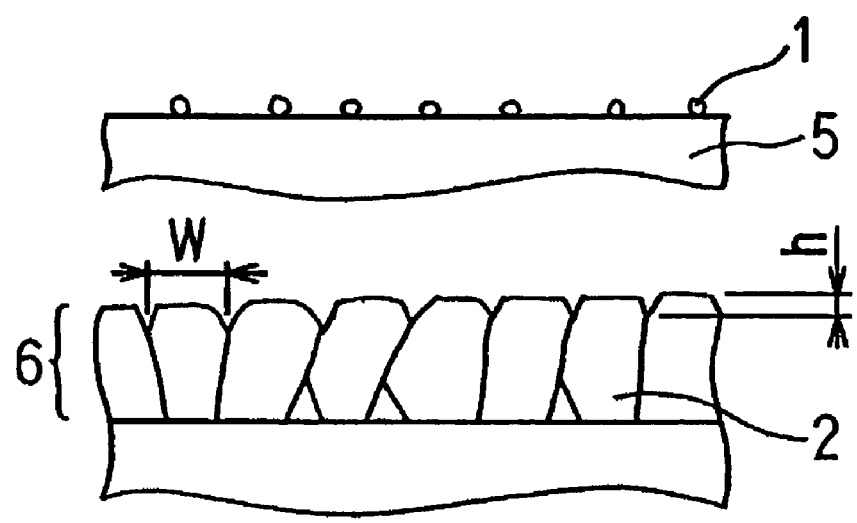
Figure 4:
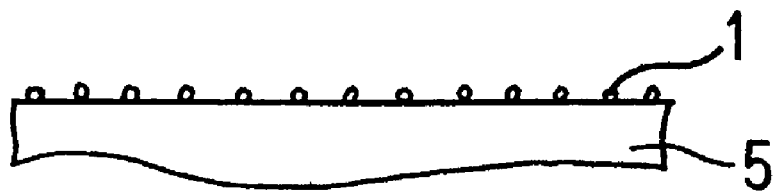
FIG. 4 is a schematic illustrative view showing how a diamond grows in another method of the prior art, with (a) through (d) showing steps of growth, respectively.
Figure 4:
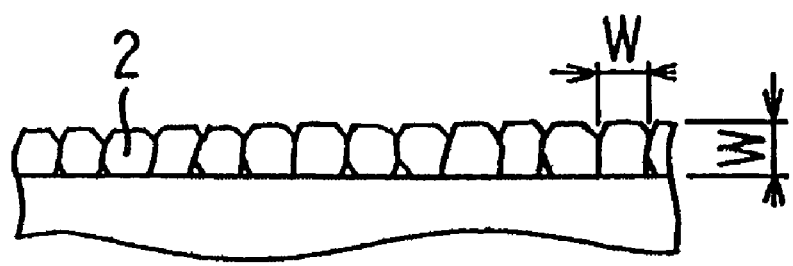
Figure 4:
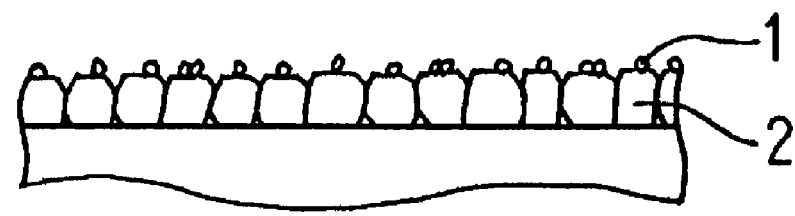
Figure 4:
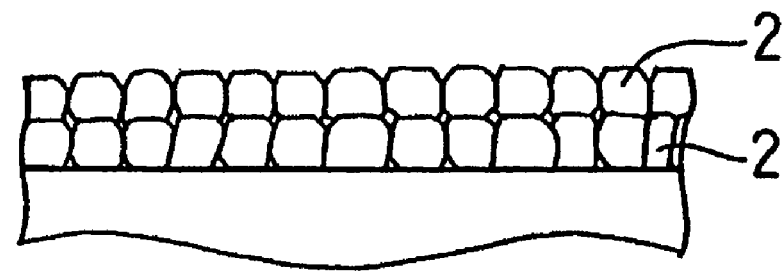
Figure 5:
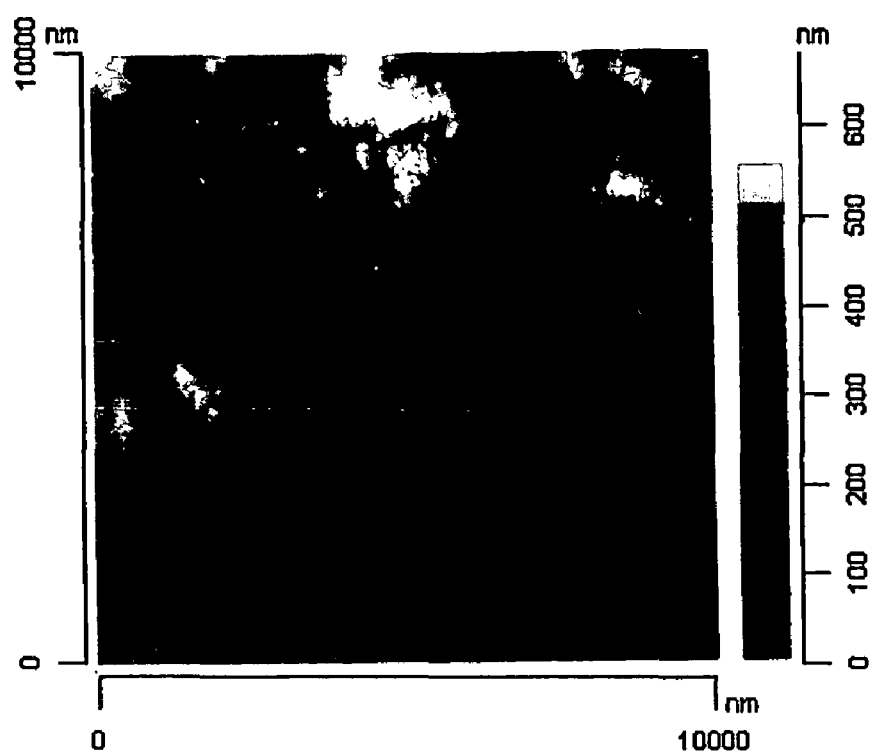
FIG. 5(a) is an AFM microphotograph showing the surface condition of a diamond coating of the present invention.
FIG. 5(b) is an AFM microphotograph showing the surface condition of another diamond coating of the present invention.
Figure 5:
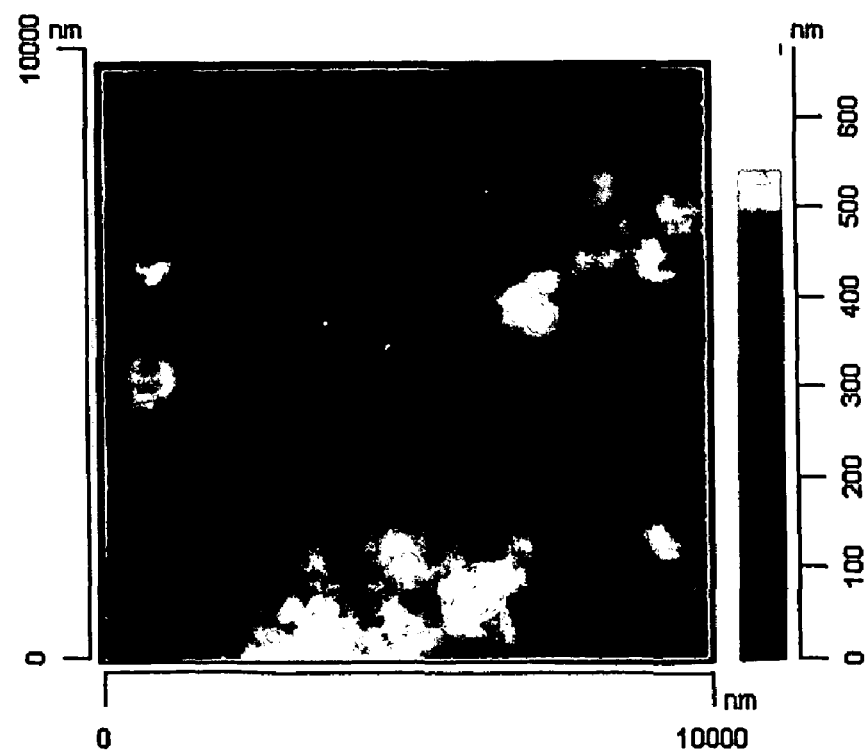
Figure 6:
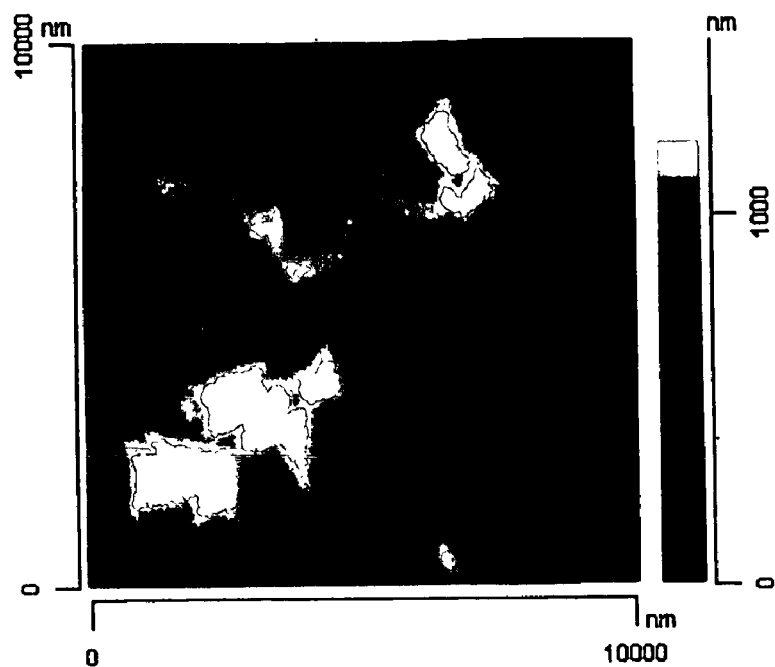
FIG. 6(c) is an AFM microphtograph showing the surface condition of a diamond coating of a comparative example.
FIG. 6(d) is an SEM microphotograph showing the surface condition of a diamond coating of the present invention.
Figure 6:
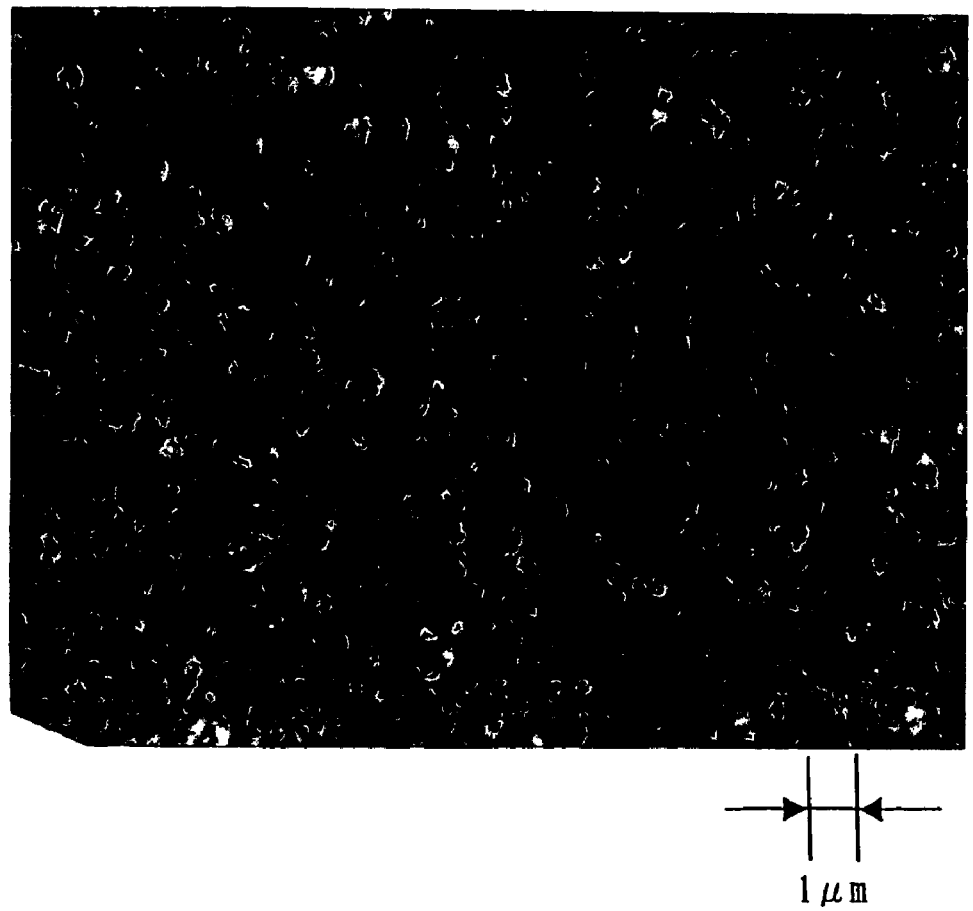
Figure 7:
FIGS. 7(a) and (b) each are a microphotograph showing a cross-section of a diamond coating obtained by the present invention.
Figure 7:
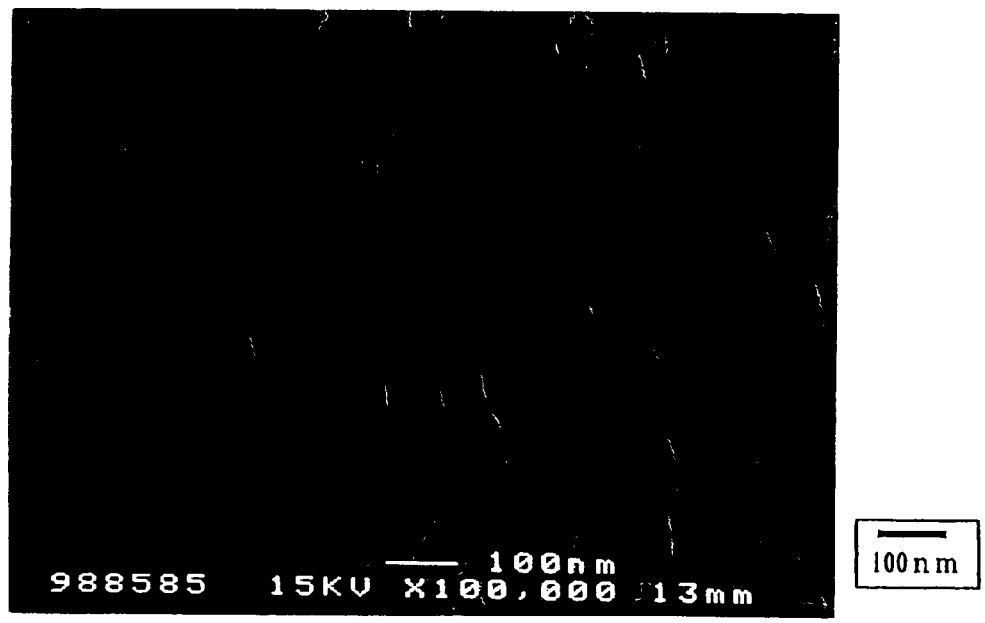
Figure 8:
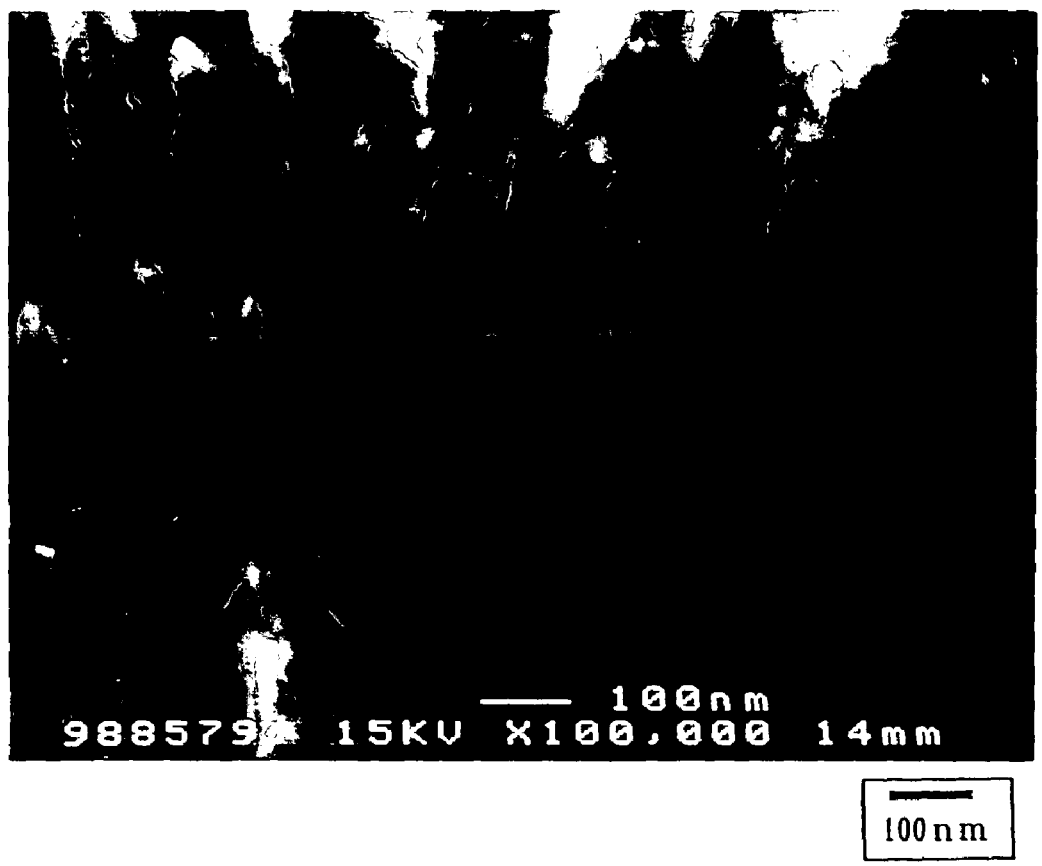
FIG. 8 is a microphotograph showing a cross-section of a diamond coating of a comparative example is shown.
Figure 10:
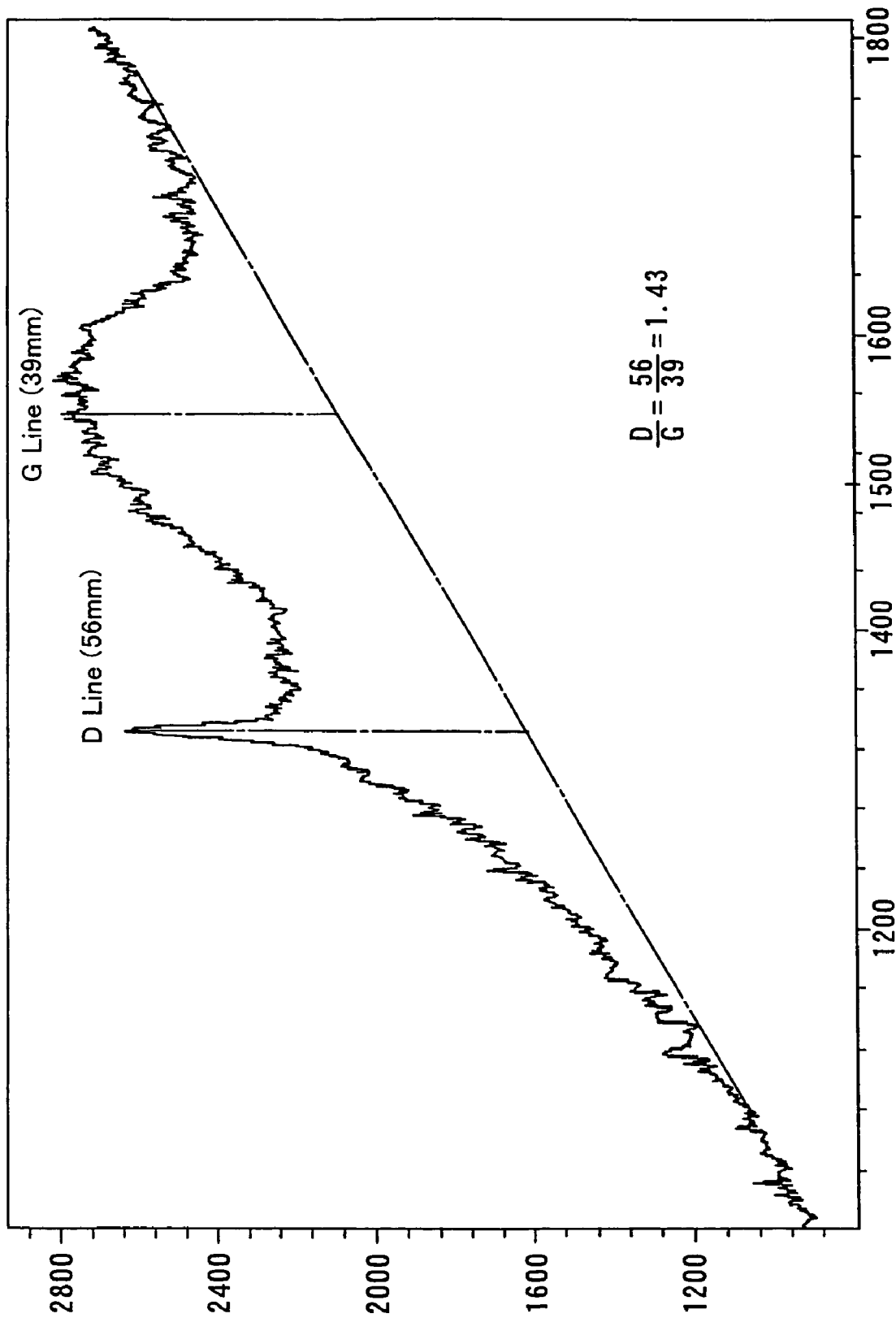
FIG. 10 is a graph showing a result of the Raman spectroscopic analysis of another diamond coating obtained by the present invention.
Figure 9:
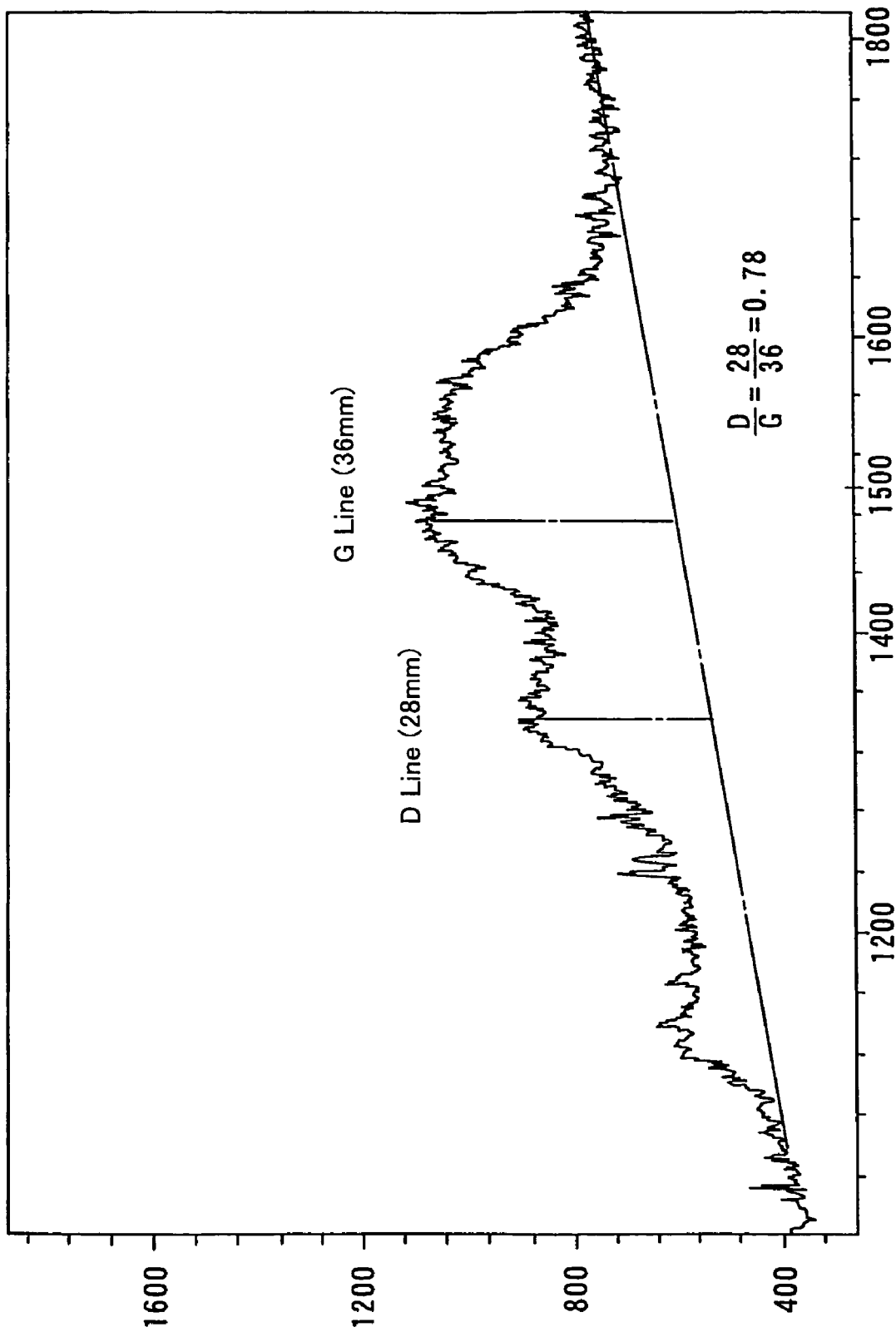
FIG. 9 is a graph showing a result of Raman spectroscopic analysis of a diamond coating obtained by the present invention.

FIG. 1 is a cross-sectional conceptual diagramkey map showing a diamond coated tool of the present invention in a zone near its surface, and FIG. 2 schematically illustrates how a diamond grows in the method of the present invention. FIGS. 3 and 4 schematically illustrates how a diamond grows in the method of the prior art, and FIGS. 5 and 6 are microphotographs of surfaces of diamond coatings, with FIGS. 5(a) and 5(b) showing AFM (atomic force microscope) and SEM (scanning electron microscope) microphotographs of diamond coatings of the present invention, FIG. 6 (c) showing an AFM microphotograph of a diamond coating of the prior art, and FIG. 6(d) showing an SEM microphotograph of a diamond coating of the present invention. FIGS. 7(a) and (b) are microphotographs of a cross-section of a diamond coating obtained by the present invention observed on SEM after having the cross-section polished and etched with a hydrogen plasma. While FIG. 8 is a microphotograph of a diamond coating of the prior art, after having its cross-section likewise polished and etched. FIGS. 9 and 10 are graphs each showing the result of Raman spectroscopic analysis of a diamond coating obtained by the present invention. FIG. 11(a) is a front view of a tap obtained by the method of the present invention, and (b) and (c) are its sectional views, respectively, and FIGS. 12(a), (b), and (c) are schematic sectional views illustrating operations using tools for IC or LSI package fabrications in a production process.

The diamond coated tool of the present invention is shown for a zone near its surface in a cross-sectional conceptual diagramkey map of FIG. 1. As is clear from FIG. 1, this tool uses a cemented carbide, cermet, etc. as a substrate 5 and a diamond coating 6 is formed on the surface of this substrate 5. A large number of diamond grains 2 get together to form aggregate 3, and these aggregates in turn join together to form the diamond coating 6. In FIG. 1, only the grains 2 existing on the surface of the diamond coating 6 are shown, but those grains inside the diamond coating 6 is omitted. Further, as will be described in detail later herein, these diamond grains 2 per se are formed of many diamond fine grains getting together (not shown in FIGS. 1 and 2). A groove 4 is formed at a place where adjacent aggregates 3 join, and the distance between the protrusion of the aggregate 3 and the bottom of the groove 4 gives the height h of unevenness or ups and downs of the diamond coating surface.

In the next place, a model of the growth process of this diamond coating is shown in FIG. 2. As a first step, after passing through carburization or like pretreatment, the substrate 5 is placed in hot-filament CVD equipment or like and exposed to predetermined process conditions including temperature, pressure, and atmosphere for generating diamond nuclei 1 on the surface of the substrate 5, as shown in FIG. 2(a). The nuclei 1 each consists of single crystals of diamond or an aggregation of such single crystals, and are left as they grow under the same conditions as those for nuclei generation until they grow to globular aggregates 3, as shown in FIG. 2(b). The globular aggregate 3 comprise an aggregation of the diamond grains 2.

Then, when letting grow the diamond grains 2 constituting the aggregate 3 as shown in FIG. 2(c), they will grow principally in a direction perpendicular to the surface of substrate 5 and at the same time in a direction parallel with the surface of substrate 5. That is, the grains grow substantially radially. This growth is continued, until adjacent aggregate 3 join together and the diamond coating 6 reaches a predetermined thickness, as shown in FIG. 2(d). According to the present invention, the average size of the diamond grains 2 which finally constitute the growth surface of the diamond coating is 1.5 micrometers or less as its upper limit, and if used for tools a highly wear-resistant diamond coating is obtained.

In this growth process, the diamond grains 2 (secondary grains) each consists of an aggregate of the diamond fine grains (primary grain) of 100 nm order. The photographs of FIG. 7 show that these grains each consists of an aggregation of diamond fine grains. FIGS. 7(a) and (b) each are a microphotograph showing a cross-section of a diamond coating obtained by the present invention. Furthermore, the diamond grains 2 gather as an aggregate 3 constituting a tertiary grain having a diameter of several micrometers to about 10 micrometers, and adjacent such aggregates 3 grow and join together to form a diamond coating of a predetermined thickness.

It is supposed from the above-described model of coating process that the number of aggregates 3 is proportional to the density of nuclei generated. If the density of nuclei generated is small, the aggregates grow large. However, if the density of nuclei generated is high, the aggregate 3 cannot grow large, and the diamond grains 2 constituting one aggregate 3 may also decrease in number, as will be described later. Moreover, the grooves 4 produced between adjacent aggregates 3 will become shallow, so that it will become difficult to differentiate such adjacent aggregates. Consequently, according to the present invention, the average grain size of diamond grains 2 constituting the growth surface of the diamond coating formed becomes as fine as 1.5 micrometers or below, as shown in FIG. 6(d),.

The diamond coating which was grown by the method of the present invention as above will be described in greater detail based on a microphotograph in comparison with the diamond coating obtained in a comparative example. FIG. 5(a), (b), and FIG. 6 (c) are microphotographs showing unevenness of the surface of diamond coating observed by an AFM (atomic force microscope). The AFM (atomic force microscope) is a microscope which derives topographic images of the unevenness in the surface of a specimen by operating a probe while keeping constant the atomic force acting between the probe and the specimen surface when the probe is brought close to the specimen surface. The AFM can measure the unevenness of very minute structure of which vertical difference cannot be determined with high precision by SEM, touching needle surface roughness gauge, or optical interference three-dimensional surface roughness gauge.

The photographs of FIG. 5(a) and (b) each shows two kinds of diamond coatings obtained by the method of the present invention. In these photographs, white portions represent higher areas of the surface and as the brightness approaches from gray to black the altitude of the surface unevenness decreases. In FIG. 5(a), fine grains gather together to form globular diamond aggregates. This bears a strong resemblance to the states shown in FIG. 2(b)-(c) schematically.

The photograph of FIG. 5(b) shows the surface condition of another diamond coating obtained by the present invention. Although this photograph as a whole appears blurred as compared with FIG. 5(a), it shows that a flat and smooth diamond coating almost without unevenness was observed. Besides, the groove running aslant in the middle area is a grinding trace produced when the substrate was ground before coating process. Generally, in the case of a flat diamond coating, the tool tends to exhibit inadequate engagement to the work material during cutting. Then, by enlarging the grinding trace of the substrate or by controlling the density of the diamond applied on the carburized substrate before diamond coating, a tool can have an adequate engagement because proper unevenness remain after the diamond coating process. If the substrate is polished, the diamond coating therein will also have a mirror surface and the resultant tool will exhibit an inferior engagement to the work.

On the other hand, FIG. 6(c) is a photograph of a diamond coating of coarse grains shown as a comparative example. This comparative example typically shows a case in which nuclei generated grow as columnar grains both in the longitudinal direction and in the lateral direction, as shown in FIG. 3, so that adjacent columnar grains grow and join together to finally forming a diamond coating. Thus, well-grown squarish diamond grains can be observed. A scale on the right-hand side of the photograph is a shade or gray scale of color representing the height difference or vertical interval in surface unevenness, and it is possible thereby to determine the height difference of surface unevenness by comparing the color shades at a specified position and other positions.

Here, FIGS. 5(a) and 6(c) are photographs obtained by observing test specimens 35 and 36 produced in the preferred embodiment 7 to be described herein later. Meanwhile, the photograph of FIG. 5(b) shows a diamond synthesized under pressure of 1.3 kPa on a carburized substrate of usual cemented carbide used for the preferred embodiment 1 to be described herein later.

Further, FIG. 6(d) is an SEM photograph showing the surface condition of a diamond coating produced by the method of the present invention. In this photograph, diamond grains with an average grain size of about 1.5 micrometers or below can be observed. The lower limit of the average grain size is the gain size of the diamond fine grain, namely primary grains. This photograph shows a diamond coating of test specimen 35 produced in the preferred embodiment 7 to be described herein later.

FIG. 7(a) and (b) are microphotographs showing in cross-section diamond coatings produced by the method of the present invention. These photographs were obtained by observing the cross-section of the diamond coating on SEM after having the cross-section polished and etched with a hydrogen plasma. The general conditions for the above-mentioned etching are processing in a microwave CVD equipment in a hydrogen atmosphere at 600-1000° C. under pressure of 0.13-13 kPa. The diamond coatings shown in this FIG. 7 had their cross-sections etched for 30 minutes at 870 ° C. under pressure of 13 kPa. The photograph of FIG. 7(a) shows a cross-section of the diamond coating at a position about 1 micrometer apart from the substrate, and FIG. 7(b) shows a cross-section of the same diamond coating at a position about 6 micrometers from the substrate. FIG. 7(b) shows columnar grains like leaves of Japanese cedar in shape which are larger those shown in FIG. 7(a). FIG. 8 is a microphotograph of a comparative example in which a cross-section of the diamond coating of the patent documents 2 mentioned previously was processed by the same method as the examples of FIG. 7 and observed on an SEM. In FIG. 8, a boundary layer of multi-layer structure appears in black. In addition, FIGS. 7(a) and (b) show a test specimens 34 of the preferred embodiment 7 to be described herein later, and FIG. 8 shows a diamond coating of a test specimen 24 of the preferred embodiment 6.

From the foregoing results of observation, it is understood that the diamond coating according to the present invention has its unique feature in a mode of growth of diamond grains. According to the present invention, nuclei each consisting of single crystals of diamond or an aggregation of such single crystals is generated and the nuclei are grown at an early stage of the coating process to form globular aggregates of polycrystalline diamond. As the grains of polycrystalline diamond grow further, the aggregates also grow so that the adjacent aggregates joins together to form a film-like coating.

It is assumed that the above-said mode of growth is attributable to the following growth mechanism of diamond coating. As clearly understood also from FIGS. 7(a) and (b), the diamond fine grains grow in a shape elongated in the growth direction of the diamond coating, and the growth will be stopped when the major axis or length of the grains reaches about 0.01-1 micrometer, and thence new diamond grains start to grow on such old grains. If this mode of growth is described in terms of minor axis diameter of the diamond fine grains, their growth will stop when the minor axis diameter reaches about 0.001-0.1 micrometer, and the succeeding new fine grains of diamond will start to grow. This shows that diamond fine grains with an aspect ratio (major axis diameter/minor axis diameter) of about 2-20 are formed.

Further, it is assumed that such thin and short columnar grains gather into a shape of leaves of Japanese cedar to form diamond grains, these diamond grains gather to form aggregates of diamond grains. Such a special diamond coating is greatly affected by the pressure of an atmosphere used for the diamond coating process especially. The diamond coating of the present invention can be obtained specifically in the pressure range of about 0.13-6.5 kPa.

If a surface of the diamond coating is microscopically observed with reference to FIGS. 5(a) and FIG. 6(d), many diamond grains exist there. Minute grooves exist in the boundary areas of these diamond grains, i.e., grain boundaries. The surface of a diamond coating is formed of aggregates consisting of many diamond grains and stripes looking black and thin which constitute boundaries between such aggregates.

As for the aggregates 3 existing in the surface of the substrate 5 of FIG. 1, it is preferred that undulation represented by height difference h be formed so as to draw non-steep moderate unevenness. The undulation represented by h are substantially correlated to average surface roughness Ra. Thus, by limiting the extent of undulation h in the range of about 50 nm to 900 nm, the engagement to a work will be improved, and thus chatter under processing or unexpected disengagement or relief of the tool will be prevented, unlike diamond coatings of merely flat and smooth surface. With a view to improving a work surface roughness, adhesion resistance and coolant retention in semi-dry cutting, etc. in addition to further improving the above-mentioned desirable effects, it is more preferable to limit the undulation in the range of about 50 nm to 700 nm.

Besides, to reduce the undulation by increasing the nucleation density, it is preferred to apply a diamond with an average grain size not greater than 500 Å on the carburized substrate 5 before forming diamond coating 6. As for the quantity of diamond thus applied, it is preferred, for example, that the quantity is not smaller than $2 \times 10^4 / mm^2$ in number of diamonds. Since the number of diamonds and the number of aggregates are substantially correlated with each other, an increase in the number of aggregates allows such aggregates to join together to form a diamond coating even if the growth of aggregates is small. In this manner, it is possible to produce a thin diamond coating formed of smaller diamond grains. Meanwhile, it becomes possible to control the extent of the above-mentioned undulation easily by controlling the number of aggregates. Moreover, it is possible to improve the engagement of tool by utilizing the grinding trace of the substrate depending on specific applications. Such undulation can be correctly measured by AFM.

FIG. 9 and FIG. 10 show typical examples of Raman spectrums of the diamond coatings obtained by the present invention. In FIG. 9 and FIG. 10, the horizontal axis represents Raman Shift ($cm^{-1}$) and the vertical axis represents spectrum intensity. According to the present invention, it is preferred that the ratio of D/G be falls in the range of about 0.5-5, where D is a peak height for diamond at a 1,330 $cm^{-1}$ position on the baseline, and G is the highest of peak heights at a 1,550±150$cm^{-1}$ position for graphite and amorphous carbon. If the ratio is smaller than 0.5, the wear resistance will decrease because of too few diamond bonds, while it exceeds 5 the toughness of diamond coating will decrease because of too many diamond bonds. FIG. 9 shows that the value of D/G is 0.78. FIG. 10 shows that the D/G ratio is 1.43. FIG. 9 and FIG. 10 represents specimens 37 and 35 of the preferred embodiment 7 to be described herein later.

Embodiment 1

In order to validate the effectiveness of conditions for generation of polycrystalline diamond aggregate 3 which is requisite constituent elements of the present invention, a strip of cemented carbide (10×10×1t (mm)) containing 5 mass % of Co was prepared as a substrate 5, and an experiment was conducted to coat the substrate with diamond film. The prepared substrates 5 included carburized substrates and non-carburized ones. For the carburization, the substrate was placed in hot-filament CVD equipment and processed for 6 hours in a 1 vol. % methane-hydrogen mixed gas atmosphere at an ambient temperature of about 900° C. under pressure of 13.0 kPa. The magnitude of saturation magnetization of the carburized substrate was 97.5-98.5 G-cm$^3$/g, while the non-carburized substrate had a saturation magnetization of 80-83G-cm$^3$/g.

Then, these substrates were coated with diamond by growing the diamond to a thickness of 10 micrometers under five varied magnitudes of synthesizing pressure of 1.3 kPa(s), 3.9 kPa, 6.5 kPa, 9.8 kPa, and 13 kPa(s), respectively, to check to see if any polycrystalline diamond aggregates were formed. When coating, the substrates had a temperature of about 850° C. The test result is shown in Table 1. Regardless of the synthesizing pressure, no diamond aggregate was formed on any of the non-carburized substrates. Further, when the diamond film forming pressure was in the range of 9.8 kPa or above, no diamond aggregate was formed even on a carburized substrate. Thus, diamond grains in which diamond aggregates were formed had an average grain size in the range of about 1-1.5 micrometers and an average surface roughness Ra in the range of about 0.07-0.15 micrometers. In addition, when the above-described cemented carbide having its Co content of 5 mass % partially substituted with 0.5 mass % of Cr for its binding phase composition was carburized under the same conditions as above and coated with diamond under pressure of 1.3 kPa, polycrystalline diamond aggregates were formed in the coating. In this case also, like other coatings in which diamond aggregates were formed, the average diamond grain size was about 1.3 micrometers and average surface roughness was about 0.1 micrometers. Further, with its magnitude of saturation magnetization of about 94 G-cm$^3$/g, this substrate was able to have a good coating.

TABLE 1

| Pretreatment of | Synthesizing pressure (kPa) | | | | |
|---|---|---|---|---|---|
| substrate | 1.3 | 3.9 | 6.5 | 9.8 | 13.0 |
| Carburized | ◯ | ◯ | ◯ | X | X |
| Non-carburized | X | X | X | X | X |

◯: Polycrystalline diamond aggregates were formed.
X: Polycrystalline diamond aggregates were not formed.

Embodiment 2

In order to determine the difference in tool performance by the extent of undulation h of the surface of a diamond coating (See FIG. 1), an end mill with a diameter of 8 mm was made and its performance was evaluated. A cemented carbide containing 5 mass % of Co was used as a substrate. This substrate was placed in hot-filament CVD equipment and processed therein for carburization for 6 hours in a 1 vol. % methane-hydrogen mixed gas atmosphere at an ambient temperature of about 900° C. under pressure of 13.0 kPa. Then, the substrate was coated with diamond so that the diamond coating grew to about 20 micrometers in thickness. The coating was formed of diamond aggregates and the average grain size of diamond was in the range of about 1.0-1.5 micrometers in all specimens. The grain boundaries of diamond formed grooves.

The diamond coating was formed using hot-filament CVD equipment with its process conditions including a hydrogen flow rate of 1,700 sccm, methane flow rate of 45 sccm, synthesizing pressure of 3.9 kPa, filament temperature of 2,120° C. and substrate temperature of 760° C. The hydrogen content was adjusted to 1.5 at % (atomic %) and the nucleation density was varied by varying the quantity of diamond applied to the substrate. In this manner, six different end mills having diamond coatings of different diamond grain size and different extents of undulation h were made and used for cutting examination of a high silicon aluminium alloy (aluminum- 12 mass % Si). Cutting conditions employed were as follows:

Cutting speed V: 400 m/min
Number of revolutions N: 15,923 rpm
Feed speed (F): 1,275 mm/min.
Feed rate per edge (f): 0.04 mm/rev.
Radial depth of cut (Rd): 0.05 mm
Axial depth of cut (Ad):18 mm
Coolant: Water-soluble emulsion The result of cutting tests performed under above conditions is shown in Table 2 below.

TABLE 2

| Specimens No. | Average surface roughness of coating Ra(μm) | Undulation h (nm) | Work surface roughness Rmax (μm) | Tool life |
|---|---|---|---|---|
| 1 (comparative example) | 0.005 | 30 | 7.85 | 3,000 m or more |
| 2 (preferred embodiment) | 0.01 | 50 | 3.21 | 3,000 m or more |
| 3 (preferred embodiment) | 0.07 | 300 | 1.71 | 3,000 m or more |
| 4 (preferred embodiment) | 0.18 | 900 | 3.51 | 3,000 m or more |
| 5 (comparative example) | 0.28 | 1,200 | 8.20 | 3,000 m or more |
| 6 (comparative example) | 0.35 | 1,500 | 11.55 | 3,000 m or more |

As can be understood from the result shown in Table 2 above, when the average surface roughness was in the range of 0.01-0.2 micrometers, the undulation h were in the range of 50-900 nm to show excellent work surface roughness, while when the average surface roughness was as small as 0.005 micrometers with too small undulation h, chatter occurred during working and the work surface roughness worsened. Meanwhile, when the surface roughness exceeded 0.2 micrometers with the larger undulation h, the unevenness in the tool surface increased also and the work surface roughness worsened accordingly. Moreover, when the specimen 4 was taken out from a deposition system before diamond coating was formed and the number of diamond aggregates was counted to be $5 \times 10^4/mm^2$. This count also coincided with the number of diamond aggregates after coating within a tolerance.

Embodiment 3

In order to determine the difference in tool performance by RMS values observed on the surface of diamond coating, an end mill with a diameter of 8mm was made and its performance was evaluated. A cemented carbide containing 5 mass % of Co was used as a substrate. This substrate was placed in hot-filament CVD equipment and processed therein for carburization for 6 hours in a 1 vol. % methane-hydrogen mixed gas atmosphere at an ambient temperature of about 900° C. under pressure of 13.0 kPa. Then, the substrate was coated with diamond so that the diamond coating grew to about 20 micrometers in thickness.

The resultant coating was formed of diamond aggregates and the average grain size of diamond was in the range of about 0.7-1.0 micrometers in all specimens. The diamond coating 6 was formed using hot-filament CVD equipment with its process conditions including a hydrogen flow rate of 1,700 sccm, methane flow rate of 45 sccm, synthesizing pressure of 3.9 kPa, filament temperature of 2,120° C. and substrate temperature of 760° C. The hydrogen content was adjusted to 1.5 at%, and six different end mills having diamond coatings of different RMS values were made by varying the density of diamond applied to the substrate and used for cutting examination of a high silicon aluminum alloy (aluminum-12 mass % Si). The same cutting conditions as those of the preferred embodiment 2 were used, and the result of the cutting test is shown in Table 3 below.

TABLE 3

| Specimens No. | Average surface roughness of coating Ra (μm) | RMS (nm) | Undulation h(nm) | Work surface roughness Rmax (μm) | Tool life |
|---|---|---|---|---|---|
| 7 (preferred embodiment) | 0.01 | 10 | 61 | 3.13 | 3,000 m or more |
| 8 (preferred embodiment) | 0.01 | 15 | 62 | 2.80 | 3,000 m or more |
| 9 (preferred embodiment) | 0.13 | 100 | 540 | 1.80 | 3,000 m or more |
| 10 (preferred embodiment) | 0.18 | 200 | 892 | 2.95 | 3,000 m or more |
| 11 (preferred embodiment) | 0.19 | 300 | 897 | 3.45 | 3,000 m or more |

As can be understood from the result shown in Table 3 above, even when the average surface roughness was fell in a specified range according to the present invention and the undulation h were in the range of 50-900 nm, the surface roughness of work tended to become higher when the RMS value was as low as 10 nm or when the undulation were as large as 300 nm. Therefore it turned out that the RMS value was preferable in the range of about 15-200 nm. Besides, the diamond coatings having an RMS in the range of 15-200 nm were superior to others in gloss.

Embodiment 4

In order to determine the difference in performance by difference in hydrogen content of a diamond coating, an end mill with a diameter of 8 mm was made and its performance was evaluated. A cemented carbide containing 5 mass % of Co was used as a substrate. This substrate was placed in hot-filament CVD equipment and processed therein for carburization for 6 hours in a 1 vol. % methane-hydrogen mixed gas atmosphere at an ambient temperature of about 900° C. under pressure of 13.0 kPa. This carburization covered an area which is at least about 5 mm apart outside from the outer border of the diamond coating along the substrate surface. Then, the substrate was coated with diamond so that the diamond coating grew to about 0.5 micrometer in thickness.

The diamond coating 6 was formed using hot-filament CVD equipment with its process conditions including a hydrogen flow rate of 1,700 sccm, synthesizing pressure of 3.9 kPa, filament temperature of 2,120° C. and substrate temperature of 760° C. To change the hydrogen content, the methane flow rate was selectively set to 90 sccm (hydrogen content: 6.0 at %), 70 sccm (hydrogen content: 5.0 at %), 40 sccm (hydrogen content: 1.0 at %) and 20 sccm (hydrogen content: 0.2 at %). The resultant coating was formed of diamond aggregates and the average grain size of diamond was in the range of about 0.2-0.4 micrometers in all specimens. Although the average surface roughness Ra of each specimen was in the range of about 0.16-0.18 micrometer, since it was difficult to make all specimens on a nanometer order together so long as the values of undulation h and RMS were concerned, such end mill specimens were prepared in approximation and used for test. The resultant different end mills having a diamond coating 6 of different hydrogen contents were subjected to cutting test of a high silicon aluminum alloy (aluminum-12 mass % Si). Cutting conditions employed were as follows:

Cutting speed V: 400 m/min
Number of revolutions N: 15,923 rpm
Feed speed (F): 1,275 mm/min.
Feed rate per edge (f): 0.04 mm/rev.
Radial depth of cut (Rd): 0.05 mm
Axial depth of cut (Ad):18 mm
Coolant: Water-soluble emulsion The result of cutting tests performed under above conditions is shown in Table 4 below.

TABLE 4

| Specimens No. | Hydrogen content (at %) | Undulation h (nm) | RMS (nm) | Work surface roughness Rmax(μm) | State after 3,000 m use |
|---|---|---|---|---|---|
| 12 (preferred embodiment) | 0.2 | 683 | 99 | 3.8 | Chipping occurred at 1 location |
| 13 (preferred embodiment) | 1.0 | 670 | 88 | 2.5 | No problem |
| 14 (preferred embodiment) | 5.0 | 674 | 95 | 2.8 | No problem |
| 15 (preferred embodiment) | 6.0 | 665 | 85 | 3.3 | Coating underwent slight wear |

As will be clearly understood from the result of Table 4, specimens having a diamond containing 1-5 at% (atomic ratio %) of hydrogen showed an excellent performance in respect of chipping and wear, while specimens having a lower hydrogen content tended to cause chipping. Further, with an excessive hydrogen content, the diamond coating 6 had a decreased wear resistance and thus was liable to wear.

Embodiment 5

Using a drill substrate having a composition in which a binding phase content is reduced in its surface layer, a drill with a diameter of 0.8 mm was made in order to determine a liability to peeling of diamond coating and substrate breakage based on difference in thickness of such surface layer, and the drill was evaluated for its performance. A cemented carbide containing 5 mass % of Co was used as a substrate. This substrate was placed in hot-filament CVD equipment and processed therein for carburization for 6 hours in a 1 vol. % methane-hydrogen mixed gas atmosphere at an ambient temperature of about 900° C. under pressure of 13.0 kPa. This carburization covered an area which is at least about 5 mm apart outside from the outer border of the diamond coating along the substrate surface. Thereafter, the substrate 5 had its surface treated with nitric acid to form a layer therein having a reduced binding phase content. By varying the acid treatment time, four different substrates having a different thickness of the layer of reduced binding phase content were prepared, and diamond coating was formed on each such substrate 5 to a thickness of 20 micrometers. Besides, substrates unsubjected to acid treatment of the substrate surface were prepared and likewise coated with diamond.

The diamond coating was formed using hot-filament CVD equipment with its process conditions including a hydrogen flow rate of 1,700 sccm, methane flow rate of 45 sccm, synthesizing pressure of 3.9 kPa, filament temperature of 2,120° C. and substrate temperature of 760° C. The resultant coating was formed of diamond aggregates and the average grain size of diamond was in the range of about 0.5-0.8 micrometers in all specimens. The average surface roughness Ra of each specimen was in the range of about 0.14-0.15 micrometer, and since it was difficult to make all specimens on a nanometer order together so long as the values of undulation h and RMS were concerned, such drill specimens were prepared in approximation and used for test. The hydrogen content was adjusted to be 1.5 at %. The resultant five drills were used for drilling test of a green formed body of SiC compact.

Cutting conditions employed were as shown below:

| Number of revolutions: | 9.550 rpm |
| Feed speed: | 1.9 m/min |
| Cutting depth: | 1.6 mm |

The result of the cutting test is shown in Table 5 below.

TABLE 5

| Specimens No. | Thickness at zone with lower binding phase content (μm) | Undulation h (nm) | RMS (nm) | Tool life |
|---|---|---|---|---|
| 16 (preferred embodiment) | 0 | 550 | 120 | 500 bores or more |
| 17 (preferred embodiment) | 10 | 535 | 97 | 500 bores or more |
| 18 (preferred embodiment) | 20 | 562 | 128 | 500 bores or more |
| 19 (preferred embodiment) | 30 | 544 | 118 | 500 bores or more (Chipping occurred at 1 location) |
| 20 (preferred embodiment) | 40 | 540 | 114 | 500 bores or more (Chipping occurred at 3 locations) |

It is possible to increase adhesion of diamond coating to the substrate by providing in the substrate surface a layer having a composition of reduced binding phase content, and it turned out that specimens having such a layer of 20 micrometers or less in thickness with a composition of reduced binding phase content exhibit particularly improved performance. However, with such a layer 30 and 40 micrometers thick having a composition of reduced binding layer content, respectively, a reduced substrate strength was observed.

Embodiment 6

A tap 11 coated with a diamond according to the present invention was fabricated. FIG. 11(a) is a schematic front view of the tap 11, and FIGS. 11(b) and (c) are partial sectional views of a portion of one cutting edge of the tap which rotates about the center O. This tap 11 has a thread portion 12 formed in the substrate 14 made of a cemented carbide. This thread portion 12 has a lead 12a having an incomplete screw thread and a full thread portion 12b having a complete screw thread contiguous to the lead. This thread portion 12 is circumferentially divided by a spiral or linear tool groove 13. And the thread portion 12 having its surface ground is coated with the above-described diamond film. Here were prepared a tap having its cutting edge formed of a ridgeline between the rake face and the flank as shown in FIG. 11(b) and another tap having a chamfer 17 formed by grinding away the ridgeline of cutting edge as shown in FIG. 11(c). Regarding the cross-section of the lead 12a and full thread portion 12b, a commonly-used tap has a configuration free of the chamfer 17 (see FIG. 11(c)), as shown in FIG. 11(b).

In this example, a tap coated with the diamond according to the present invention and a tap having a diamond coating of the prior art were fabricated and compared each other for evaluation of performance. Both taps were coated with diamond to a coating thickness of 10 micrometers and used to drill an M3 screw hole(Japanese Industrial Standard). The specimens 21-23 representing the present invention and the specimens 24 and 25 of the comparative example are of four cutting edges as shown in the front view of the tap of FIG. 11(a), and these specimens employed a substrate 14 having a partially chamfered cross-section as shown in FIG. 11(c). As for the specimen 26 as a comparative example, a substrate 14 without chamfer was used, for which a front view is shown in FIG. 11(a) with its partial cross-section shown in FIG. 11(b).

A cemented carbide containing 5 mass % of Co was used as material of the substrate 14. For the specimens 21-25, a rake face 15 was formed with a rake angle of β=3° as shown in FIG. 11(b), and further a chamfer 17 was formed from the tip of cutting edge 18 to a flank 16 so that it had a chamfer angle of α=−20° as shown in FIG. 11(c). The chamfer 17 was finished so that its surface roughness Ra came to 0.2 micrometers, and the chamfer 17 was 0.4 mm in width shown in FIG. 11(c). The specimen 26 differed from the specimens 21-25 in that the M3 tap had a rake face 15 with a rake angle of β=−20° and that it had no chamfer.

These substrates 14 were carburized as a pretreatment. The substrates 14 were placed in hot-filament CVD equipment and processed therein for carburization for 6 hours in a 10 vol. % methane-hydrogen mixed gas atmosphere at an ambient temperature of about 900° C. under pressure of 13.0 kPa. This carburization was accomplished by heating a surface to be coated with diamond including an area at least about 5 mm apart outside from the outer border of the diamond coating along the substrate surface. For the specimen 23, Co constituting a binding phase of the cemented carbide substrate was removed by treating it with nitric acid after carburization to a depth of about 20 micrometers from its surface. hereafter, the substrates of the specimens 21-26 were immersed in a solution prepared by dispersing a ultrafine particle polycrystalline diamond in an organic solvent and ultrasonic wave was irradiated thereto to apply the ultrafine particle diamond to the substrates with the aid of ultrasonic wave.

Except for the specimen 24, hot-filament CVD equipment was used for diamond coating process under the conditions shown in Table 6. The resultant diamond coatings were formed of diamond aggregates and the diamond grains constituting such aggregates had a gain size as shown in Table 7. In order to obtain 10 micrometers thickness of the coating layers of the specimens 21-23 of the present invention and comparative examples 25 and 26, the growth of diamond coating was suspended and actual coating thickness was measured when the thickness was expected to have reached 9 micrometers. Then, it turned out that all had a thickness of 8.5 micrometers or above and the diamond coatings were formed in single layer for a 70% or larger range of their finish thickness of 10 micrometers. A trace of interrupted growth was observed remaining in cross-section of the diamond coating.

The specimen 24 represents a replication of the technique disclosed in the patent documents 2. For this specimen, no carburization was performed, but its substrate surface was treated by sandblast. Moreover, the specimen 24 was coated with diamond using a microwave equipment instead of hot-filament CVD equipment. For the specimen 24, the process conditions for nucleus deposition and for developing nuclei to diamond grains were different from each other, and the diamond coating was formed by repeating those conditions. Specifically, in Table 6, the top in the row of specimen 24 represents process conditions of nucleus deposition, while the bottom in the same row representing conditions for growing nuclei. In the process of growing nuclei, processing time was set so that the resultant diamond grains were 1 micrometer or below in size. Consequently, a diamond coating formed of ten layers could be produced with a grain size not greater than 1 micrometer, but no undulation could be observed since the diamond was not formed of grain aggregates like the present invention. FIG. 8 A shows a photograph of a cross-section of this specimen as polished and etched with a hydrogen plasma.

TABLE 6

| Specimen No. | Coating pressure (kPa) | Coating gas(sccm) | | Coating temperature (° C.) | |
|---|---|---|---|---|---|
| | | $H_2$ flow rate | $CH_4$ flow rate | Filament | Substrate |
| 21 (preferred embodiment) | 3.9 | 1700 | 20 | 2120 | 760 |
| 22 (preferred embodiment) | 3.9 | 1700 | 45 | 2120 | 760 |
| 23 (preferred embodiment) | 3.9 | 1700 | 45 | 2120 | 760 |
| 24 (comparative example) | 1 | 500 | 100 | Microwave | 800 |
| | 3.9 | 500 | 10 | Microwave | 850 |
| 25 (comparative example) | 13.3 | 1000 | 12 | 2150 | 760 |
| 26 (comparative example) | 13.3 | 1000 | 12 | 2150 | 760 |

The states of developed diamond coatings are summarized for each specimen in Table 7 below. The specimens 21-23 had an average surface roughness Ra in the range of 0.16-0.18 micrometer. Other specimens had 15 an average surface roughness Ra smaller than 0.01 micrometer.

TABLE 7

| Specimens No. | Undulation (nm) | Grain size (μm) | $H_2$ content (at %) | RMS (nm) | Cutting force (N) | Peelings (number) | Adhesion thickness (μm) |
|---|---|---|---|---|---|---|---|
| 21 (preferred embodiment) | 680 | 0.5-0.8 | 0.2 | 97 | 6 | 1 | 0 |
| 22 (preferred embodiment) | 670 | 0.5-0.8 | 1.5 | 95 | 6 | 0 | 0 |
| 23 (preferred embodiment) | 690 | 0.5-0.8 | 1.5 | 101 | 6 | 0 | 0 |
| 24 (comparative example) | Not observed | 0.5-0.8 | 0 | 120 | 9 | 3 | 0 |
| 25 (comparative example) | Not observed | 10-12 | 0 | 396 | 10 | 4 | 1 |
| 26 (comparative example) | Not observed | 10-12 | 0 | 405 | 16 | 8 | 5 |

The respective tap specimens having there surfaces left unpolished were subjected to test, in which holes formed in MMC (Al-30 mass % SiC) were worked using these taps, with worked holes totaling to 700 per tap in number. For evaluation, the adhesion thickness, cutting force and the number of peeled diamond coatings were observed. For evaluation of the adhesion thickness, measurement was made at one site on the rake face of the thread portion lead. For cutting force evaluation, were measured and averaged the cutting forces encountered in the direction of Y-axis (rotative direction) when processing the first through fifth holes. In Table 7, the peeling is given in number of peelings in each tap used through the above-described tapping test.

The result of the above test is shown in Table 7. Taps coated having the diamond coating of the present invention underwent adhesion very few with less peelings of diamond coating. Especially, peeling was not observed on the specimen 22 in which the hydrogen content was increased as 1.5 at % and on the specimen 23 that was treated with nitric acid after carburization to provide a graduated composition in its substrate surface. Moreover, these specimens exhibited a small cutting force with a good engagement to works due to minute undulation in the surface. On the other hand, although the specimen 24 of the comparative example was most smooth in diamond coating surface, it tended to encounter a larger cutting force due to its slipperiness and engaging difficulty. The specimens 25 and 26 having a diamond coating formed of grains with a larger grain size underwent adhesion and an peeling of diamond coating. Further, these specimens showed a higher surface roughness of diamond coating and encountered a larger cutting force.

Figure 11:
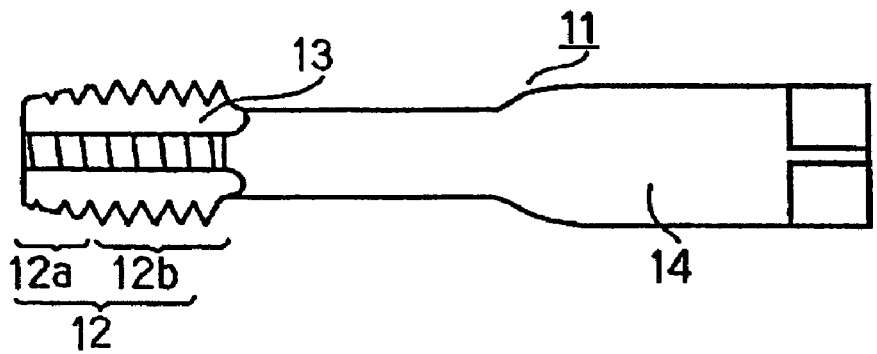
FIG. 11(a) is a front view of a tap obtained by the method of the present invention, and (b) and (c) are its sectional views, respectively.
Figure 11:
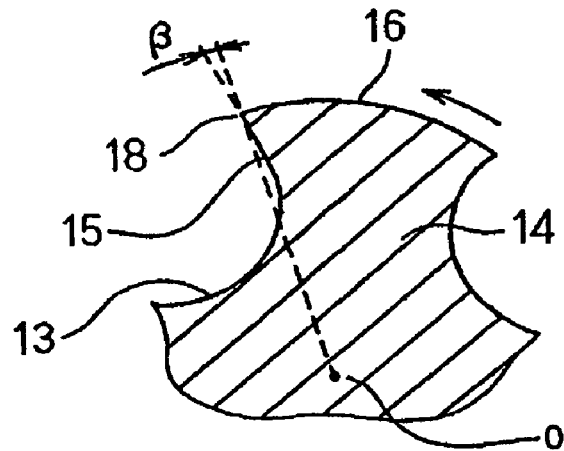
Figure 11:
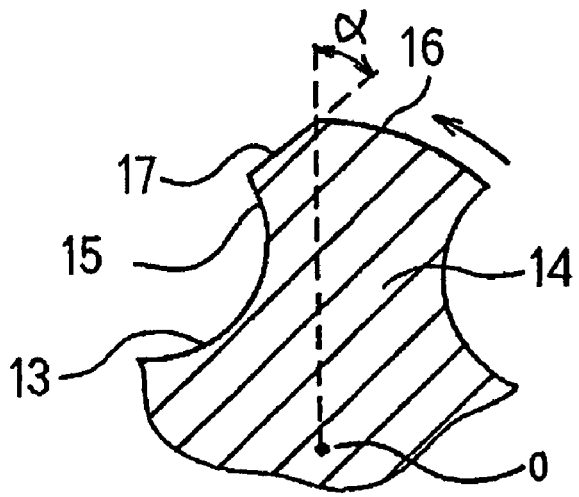

To summarize the preferred embodiment of tap, it is preferred that the tap having the diamond coating of the present invention be provided with a chamfer of a negative angle, as shown in FIG. 11(*c*). This configuration is effective in preventing any soft metal from undergoing adhesion to the tool and any built-up edges from growing in working. Besides, not only the chips are minutely divided to prevent them from jamming between the tool and work in its hole under cutting, but the adhered metal can be automatically removed without difficulty if any adhesion occurs. In this regard, it is necessary to reverse the tap upon completion of working to draw it out of the work, and then such a chamfer permits easy removal of adhesion, if any. Although it is effectively advantageous to provide the chamfer at the lead 12*a*, it is also preferable to provide such a chamfer further in the full thread portion 12*b*. Preferably, the chamfer angle ranges from about −60° to −5°.

Embodiment 7

A tip (ISO number of cutting tool SEGN120308) was fabricated from a cemented carbide having a composition of 4 mass % Co-WC. Then, the resultant tip was placed in hot-filament CVD equipment and carburized for 6 hours in a 10 vol. % methane-hydrogen mixed gas atmosphere at 850° C. under pressure of 6.5 kPa. In order to form in a surface layer a zone or layer having a composition in which a binding phase content is reduced, the resultant tip was immersed in an 8% nitric acid solution to remove the binding phase of the cemented carbide in the surface layer, followed by washing and drying.

Then, a ultrafine particle diamond was applied to the tip. For this, 0.002 g of a polycrystalline diamond powder of 4-6nm in gain size was dissolved and dispersed in 100 cc of isopropyl alcohol. The tip was immersed in the resultant solution and the polycrystalline diamond was applied to the tip therein under irradiation of ultrasonic wave for 10 minutes. Thereafter, the tip was coated with diamond in an atmosphere having a 2 vol. % methane concentration at a filament temperature of 2,050° C. and substrate temperature of 850° C. under pressure shown in Table 8, where the interval between the tip and the filament was set at 5 mm. As for the thickness of diamond coating, the specimens 30-36 and the specimen 37 had coatings 10 micrometers thick and 2 micrometers thick, respectively. The tips were fabricated through those processes indicated by circle symbols in Table 8, and processes without circle symbols were skipped. However, for the specimens 31-36 and for the specimen 37, the coating operation was suspended when the coating thickness was expected to reach 9 micrometers and 1.5 micrometers, respectively, to measure their actual thicknesses and thereafter the coating operation was restarted for covering the remaining thicknesses. Traces of interrupted growth were observed remaining as boundaries in cross-section of the diamond coating. The specimens were measured also for average surface roughness Ra. The result of this measurement is shown in Table 8, as well. Further, the specimen 34 was subjected to an X-ray diffractometry analysis, and hardness and average surface roughness tests. This specimen had a peak intensity $I_{220}/I_t$ of 0.8 in X-ray diffractometry, where $I_{220}$ is a peak intensity of the diamond crystal face (220) and $I_t$ is a total of peak intensities of diamond crystal faces (111), (220), (311), (400) and (331). Also, it had a hardness of 7,500 kgf/mm². As an example of the preferred embodiment of the present invention, the cross-section of the specimen 34 is shown in the microphotographs of FIGS. 7(*a*) and (*b*).

TABLE 8

| Specimens No. | Carburization | Acid treatment | Diamond application | Pressure for diamond coating (kPa) | | | | Surface roughness Ra (μm) |
| --- | --- | --- | --- | --- | --- | --- | --- | --- |
| | | | | 0.5 | 1.3 | 3.9 | 13 | |
| 30 (comparative example) | | | ○ | ○ | ○ | | | 0.5 |
| 31 (preferred embodiment) | | ○ | | ○ | | ○ | | 0.06 |
| 32 (comparative example) | | ○ | ○ | | | | ○ | 0.9 |

TABLE 8-continued

| Specimens No. | Carburization | Acid treatment | Diamond application | Pressure for diamond coating (kPa) | | | | Surface roughness Ra (μm) |
|---|---|---|---|---|---|---|---|---|
| | | | | 0.5 | 1.3 | 3.9 | 13 | |
| 33 (preferred embodiment) | ○ | ○ | ○ | ○ | | | | 0.02 |
| 34 (preferred embodiment) | ○ | ○ | ○ | | ○ | | | 0.05 |
| 35 (preferred embodiment) | ○ | ○ | ○ | | | ○ | | 0.05 |
| 36 (comparative example) | ○ | ○ | ○ | | | | ○ | 0.5 |
| 37 (preferred embodiment) | ○ | ○ | ○ | | | ○ | | 0.04 |

When the resultant diamond coatings of these specimens were examined, it turned out that the specimen 30 which was not carburized had not a practically sufficient peel strength. Further, the specimens 32 and 36 fell outside the scope of the present invention, since they had an average grain size over 1.5 micrometers in the surface of diamond coating due to excessive pressure during their coating process. Other specimens successfully had a fine average grain size not greater than 1.5 micrometers.

The tips thus prepared were subjected to cutting test. A high silicon aluminum (aluminum-18 mass % Si) was used as a work material for this test and the cutting conditions included a cutting speed V=800 m/min, feed F=0.1 mm/rev, and cutting depth d=0.5 mm, while using an water emulsion as coolant. The cutting length amounted to 3,000 m. As a result of test, it turned out that the specimens 33, 34, 35, and 37 of the present invention had a long tool life and yielded an excellent surface finish of works. When compared with these specimens of the present invention, the specimen 31 also of the present invention underwent small peeling at one site on its flank, but was regarded fully acceptable practically.

Embodiment 8

Figure 12:
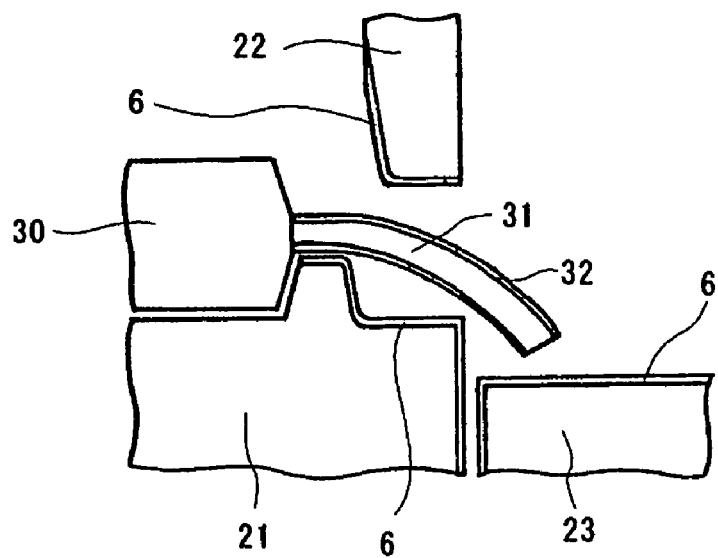
FIGS. 12(a), (b), and (c) are schematic sectional views illustrating operations using tools for IC or LSI package fabrications in a production process.
Figure 12:
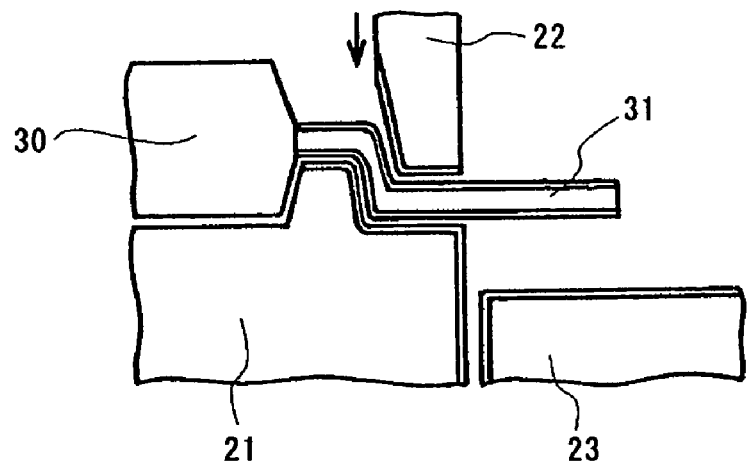
Figure 12:
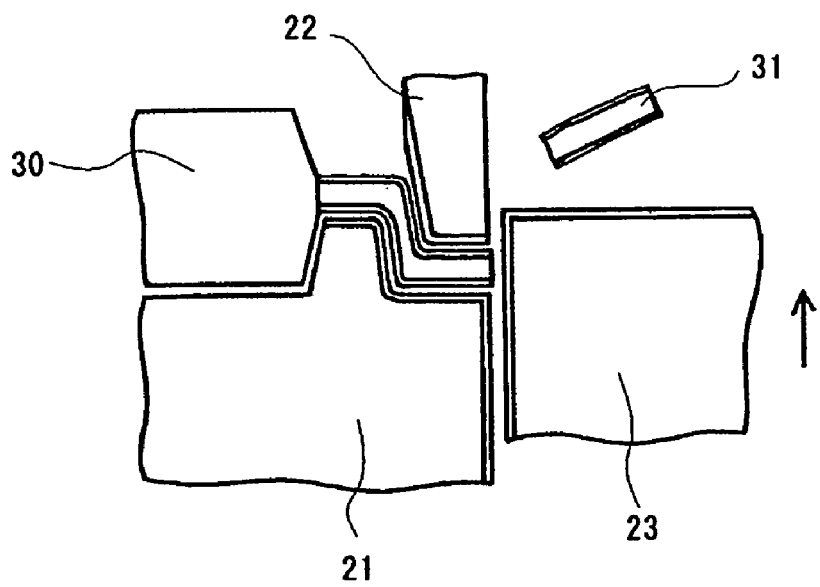

On a polished substrate of a cemented carbide with a composition of 5.5 mass % Co-WC, a diamond coating was formed under the same conditions as in the specimens 30-37 produced in the preferred embodiment 7 consequently to obtain the specimens 40-47. Specifically, the specimens 40 and 41 were prepared under the same conditions as those of the specimens 30 and 31, respectively, and so forth. The tool specimen was configured as a tool for fabrication of IC and LSI packages, as shown in FIG. 12. FIG. 12 is a schematic sectional view illustrating the operation and function of such a tool involved in the fabrication process of IC and LSI packages, with arrows showing the operational directions of tool. Since such a package usually has a large number of outer leads disposed as spaced apart by a small interval from each other, the adjacent outer leads could contact each other and occasionally hamper mounting to produce rejects if they unexpectedly bend during cutting. Therefore, such unintended bend of outer leads must be minimized as possible.

Here, a description will be made on the operation of the IC-LSI packages fabrication system comprising a bending die 21, a bending-cutting punch 22, and a cutting die 23. FIG. 12(a) shows a package 30 as placed on the bending die 21. The outer lead 31 extends over the bending die 21 to reach a space over the cutting die 23.

FIG. 12(b) shows a bending-cutting punch 22 lowered in the direction of arrow to press down the outer lead against the bending die 21 to bend it. Upon pressing, a solder covering the outer lead is strongly brought into contact with the bending die 21 and the bending-cutting punch 22, and thus the solder may deposit on the tool.

FIG. 12(c) shows the outer lead having its odd length portion cut. Namely, as the bending-cutting punch 22 pressed down the outer lead 31, the cutting die 23 is lifted up in the direction of the arrow and cuts away such an odd length of the outer lead 31 by a shear produced between the die 23 and the bending-cutting punches 22. This process also causes the solder to deposit on the tool.

Using these punches and die, outer leads covered with a lead-free solder were bent in the processes as shown in FIG. 12. The tools for IC-LSI packages fabrication consisting of the specimens 43, 44, 45 and 47 underwent no solder deposition and could be used 1 million times of working. Although the specimen 41 underwent a small peeling of the diamond coating after 1 million times of working, it was fully acceptable practically. Meanwhile, the specimen 40 as a comparative example does not have a sufficient peel strength for withstanding a practical use, and the tools for IC-LSI packages fabrication consisting of the specimens 42 and 46 underwent solder deposition by 300,000 times of working.

INDUSTRIAL APPLICABILITY

The present invention is applicable to various fields including working of aluminum alloys or magnesium alloys involving hard or difficult machinability and requiring lower roughness of work surfaces, drilling of glass-reinforced epoxy resins or like materials requiring sharpness of cutting edges as major cutting edges. It is also applicable cutting of ceramics such as alumina, silicon carbide, silicon nitride, etc. Further, it is used as tools for IC or LSI packages fabrication.

The invention claimed is:
1. A diamond coated tool comprising:
a substrate; and
a polycrystalline diamond coating formed on a surface of the substrate, wherein
said substrate is made of a cemented carbide or a cermet,
said polycrystalline diamond coating is an aggregate of secondary diamond grains, each of which includes an aggregate of primary diamond fine grains, the primary diamond fine grains having a first crystal structure and the secondary diamond grains having a second crystal structure different from the first crystal structure, said secondary diamond grains constituting a growth surface of said polycrystalline diamond coating has an average grain size of about 1.5 micrometers or below, grain boundaries are formed between each of said secondary diamond grains, said primary diamond fine grains are elongated in a growth direction of said polycrystalline diamond coating, said primary diamond fine grains have a major axis diameter ranging from 0.01 micrometer to 1 micrometer, said polycrystalline diamond coating has a thickness ranging from about 0.1 micrometer to 20 micrometers, and said polycrystalline diamond coating has an average surface roughness Ra ranging from about 0.01 micrometer to 0.2 micrometer.

2. The diamond coated tool according to claim 1, wherein:
said diamond fine grains are disposed as elongated fine grains extending longitudinally in a growth direction of the diamond coating in cross-section thereof and have a minor axis diameter in the range of about 0.001 micrometer to 0.1 micrometer.

3. The diamond coated tool according to claim 2, wherein said diamond fine grains have an aspect ratio ranging from about 2 to 20.

4. The diamond coated tool according to claim 1, wherein said diamond coating satisfies the relationship between the peak height D for diamond and the peak height G for graphite or an amorphous carbon in a Raman spectroscopic analysis: about $0.5 \leq D/G \leq$ about 5.

5. The diamond coated tool according to claim 1, wherein said diamond coating has a ratio $I_{220}/I_t$ not smaller than about 0.6, where $I_{220}$ is a peak intensity of the diamond crystal face (220) and $I_t$ is a total of peak intensities of diamond crystal faces (111), (220), (311), (400) and (331) as observed in X-ray diffractometry of said diamond coating.

6. The diamond coated tool according to claim 1, wherein said diamond coating has a hydrogen content in the range of about 1% to 5% by atomic ratio (at %).

7. The diamond coated tool according to claim 1, wherein said diamond coating is formed as a single layer in a cross-sectional zone of about 70% of its thickness above the substrate surface.

8. The diamond coated tool according to claim 1, wherein said substrate comprises a cemented carbide containing about 0.1 mass % to 6 mass % of Co.

9. The diamond coated tool according to claim 8, wherein said substrate having its Co content partially substituted with Cr has a magnitude of saturation magnetization not smaller than 1,900×(binding phase content of alloy (by mass %))/100×0.93 (G-cm$^3$/g) but not greater than 2,023×(binding phase content of alloy (by mass %))/100 (G-cm$^3$/g).

10. The diamond coated tool according to claim 8, wherein said diamond coating is formed partially on the substrate surface, and said substrate has a magnitude of saturation magnetization Ms satisfying the following condition A in its area that is at least about 5 mm apart outside from the outer border of the diamond coating along the substrate surface:

A: 1,900×(binding content of alloy (mass %))/100 (G-cm$^3$/g)$\leq$Ms$\leq$2,023×(binding content of alloy (mass %))/100 (G-cm$^3$/g).

11. The diamond coated tool according to claim 8, wherein:
said substrate has its Co content partially substituted with Cr;

said diamond coating is formed partially on the substrate surface; and said substrate has a magnitude of saturation magnetization Ms satisfying the following condition B in its area that is at least about 5 mm apart outside from the outer border of the diamond coating along the substrate surface:

B: 1,900×(binding content of alloy (mass %))/100×0.93 (G-cm$^3$/g)$\leq$Ms$\leq$2,023×(binding content of alloy (mass %))/100 (G-cm$^3$/g).

12. The diamond coated tool according to claim 1, wherein said substrate has a magnitude of saturation magnetization not smaller than 1,900×(binding phase content of alloy (by mass %)) /100(G-cm$^3$/g) but not greater than 2,023×(binding phase content of alloy (by mass %)) /100(G-cm$^3$/g).

13. The diamond coated tool according to claim 1, wherein said diamond coating has surface unevenness in the range of about 15 nm to 200 nm in RMS (root mean square) value as measured by an atomic force microscope.

14. The diamond coated tool according to claim 1, wherein said substrate has in its outer zone closer to its surface a composition having a binding phase content lower than that in its inner area inside the outer zone, and the outer zone ranges from about 1 micrometer to 20 micrometers in depth.

15. The diamond coated tool according to claim 1, wherein diamond coating is provided as it is produced through a vapor-phase synthesis process.

\* \* \* \* \*